(12) United States Patent
Chugg et al.

(10) Patent No.: US 7,673,213 B2
(45) Date of Patent: Mar. 2, 2010

(54) METHOD AND APPARATUS FOR COMMUNICATIONS USING IMPROVED TURBO LIKE CODES

(75) Inventors: Keith Michael Chugg, La Canada, CA (US); Paul Kingsley Gray, San Diego, CA (US)

(73) Assignee: Trellisware Technologies, Inc., San Diego, CA (US)

( * ) Notice: Subject to any disclaimer, the term of this patent is extended or adjusted under 35 U.S.C. 154(b) by 858 days.

(21) Appl. No.: 11/203,683

(22) Filed: Aug. 12, 2005

(65) Prior Publication Data

US 2006/0031737 A1  Feb. 9, 2006

Related U.S. Application Data

(63) Continuation-in-part of application No. 11/060,081, filed on Feb. 16, 2005.

(60) Provisional application No. 60/601,299, filed on Aug. 13, 2004, provisional application No. 60/546,270, filed on Feb. 19, 2004.

(51) Int. Cl.
*H03M 13/00* (2006.01)
*H03M 13/03* (2006.01)
(52) U.S. Cl. ...................... 714/755; 714/790
(58) Field of Classification Search ............ 714/755, 714/790
See application file for complete search history.

(56) References Cited

U.S. PATENT DOCUMENTS

| | | | |
|---|---|---|---|
| 4,713,817 A | 12/1987 | Wei | |
| 4,888,775 A | 12/1989 | Karabed et al. | |
| 5,214,672 A | 5/1993 | Eyuboglu et al. | |
| 5,392,299 A * | 2/1995 | Rhines et al. | 714/756 |
| 6,016,568 A | 1/2000 | Wolf et al. | |
| 6,023,783 A * | 2/2000 | Divsalar et al. | 714/792 |
| 6,029,264 A * | 2/2000 | Kobayashi et al. | 714/755 |
| 6,031,874 A | 2/2000 | Chennakeshu et al. | |
| 6,081,919 A | 6/2000 | Fujiwara et al. | |
| 6,166,667 A * | 12/2000 | Park | 341/94 |
| 6,202,189 B1 | 3/2001 | Hinedi et al. | |
| 6,266,795 B1 * | 7/2001 | Wei | 714/755 |
| 6,289,486 B1 * | 9/2001 | Lee et al. | 714/788 |
| 6,351,832 B1 * | 2/2002 | Wei | 714/701 |
| 6,353,900 B1 | 3/2002 | Sindhushayana et al. | |
| 6,377,610 B1 * | 4/2002 | Hagenauer et al. | 375/136 |

(Continued)

OTHER PUBLICATIONS

Chugg, Keith M. A new Class of Turbo-Like Codes with Desirable Practical Properties, Comm. Theory Workshop May 6, 2004.

(Continued)

*Primary Examiner*—Joseph D Torres
(74) *Attorney, Agent, or Firm*—Townsend and Townsend and Crew LLP

(57) ABSTRACT

Methods, apparatuses, and systems are presented for performing data encoding involving encoding data bits according to an outer convolutional code to produce outer encoded bits, processing the outer encoded bits using an interleaver and a single parity check (SPC) module to produce intermediate bits, encoding the intermediate bits according to an inner convolutional code to produce inner encoded bits, processing the inner encoded bits using a puncture module to produce punctured bits, and combining the data bits and the punctured bits to produce encoded outputs. Methods, apparatuses, and systems are also presented for performing data decoding based on soft channel metrics derived from a channel using various iterative techniques.

5 Claims, 23 Drawing Sheets

U.S. PATENT DOCUMENTS

| | | | |
|---|---|---|---|
| 6,473,878 B1 * | 10/2002 | Wei | 714/755 |
| 6,484,283 B2 * | 11/2002 | Stephen et al. | 714/786 |
| 6,625,775 B1 * | 9/2003 | Kim | 714/755 |
| 6,690,739 B1 | 2/2004 | Mui | |
| 7,010,051 B2 * | 3/2006 | Murayama et al. | 375/262 |
| 7,093,179 B2 * | 8/2006 | Shea | 714/755 |
| 7,185,260 B2 | 2/2007 | Coombs et al. | |
| 2002/0061071 A1 | 5/2002 | Cameron et al. | |
| 2005/0216819 A1 * | 9/2005 | Chugg et al. | 714/786 |

OTHER PUBLICATIONS

FlexiCodes: A Highly Flexible FEC Solution, Whitepaper Trellisware Technologies, Inc. Apr. 6, 2004.

Aji, Srinivas M. et al., "The generalized distributive law", IEEE Transactions on Information Theory, 46(2):325-43, Mar. 2000.

Bahl, L.R. et al., "Optimal decoding of linear codes for minimizing symbol error rate", IEEE Transactions on Information Theory, Mar. 1974, pp. 284-287.

Gallager, R.G., "Low-density parity-check Codes", IRE Transactions on Information Theory, Jan. 1962, pp. 21-28.

Kschischang, Frank R. et al., "Factor graphs and the sum-product algorithm", IEEE Transactions on Information Theory, 47(2):498-519, Feb. 2001.

MacKay, D.J.C. et al., "Near Shannon limit performance of low density parity check codes", Electronics Letters, 32(18):1645-46, Aug. 29, 1996.

Richardson, Thomas J. et al., "Design of capacity-approaching irregular low-density parity-check codes", IEEE Transactions on Information Theory, 47(2):619-37, Feb. 2001.

Abbasfar et al."Accumulate repeat accumulate codes," proceedings of the IEEE Communications Society, Blobcon 2004, pp. 509-513 (Dec. 2004).

Abbasfar et al."Accumulate repeat accumulate codes," proceedings of the IEEE International Symposium on Information Theory (ISIT), p. 505 (Jul. 2004).

Chugg et. al. "A New Class of Turbo-like Codes with Universally Good Performance and High-Speed Decoding", Proc. IEEE Military Comm. Conf. (Oct. 2005).

Jin et al. "Irregular repeat accumulate codes," in Turbo Code Conf., Brest, France, (Sep. 2000).

Ping "The SPC technique and low complexity turbo codes," Proc. Globecom Conf., Rio de Janeiro, Brazil, pp. 2592-2596 (Dec. 1999).

U.S. Appl. No. 11/060,081, Office Action dated Feb. 6, 2008, 13 pages.

U.S. Appl. No. 11/060,081, Office Action dated Aug. 20, 2008, 15 pages.

U.S. Appl. No. 11/060,081, Final Office Action dated Mar. 3, 2009, 18 pages.

U.S. Appl. No. 11/060,081, Office Action dated Jun. 9, 2009, 21 pages.

* cited by examiner

METHOD AND APPARATUS FOR COMMUNICATIONS USING IMPROVED TURBO LIKE CODES

CROSS-REFERENCES TO RELATED APPLICATIONS

The present application is a continuation-in-part of U.S. patent application Ser. No. 11/060,081, filed Feb. 16, 2005, entitled "METHOD AND APPARATUS FOR COMMUNICATIONS USING TURBO LIKE CODES," having Keith Michael Chugg, Paul Kingsley Gray, Georgios Dimitrios Dimou, and Phunsak Thiennviboon listed as inventors. The present application also claims priority from U.S. Provisional Application No. 60/601,299, filed Aug. 13, 2004, entitled "METHOD AND APPARATUS FOR COMMUNICATIONS USING IMPROVED TURBO LIKE CODES," having Keith Michael Chugg, Bob Ward, and Paul Kingsley Gray listed as inventors. The complete disclosures of both the Ser. Nos. 11/060,081 and 60/601,299 applications are incorporated herein by reference.

BACKGROUND OF THE INVENTION

Error correction codes have been widely used for transmission and/or storage of data in real world environments. Such environments may introduce noise, interference, and other effects that can deteriorate the quality of the data transmitted or stored, such that upon recovery, the data may contain errors. Generally speaking, error correction coding utilizes codes to add redundancy to the data transmitted or stored so that the redundancy can later be exploited to correct errors when the data is recovered.

Traditional forward error correction (FEC) codes have been commonly adopted as error correction codes in data transmission and storage systems. These traditional FEC codes include block codes and convolutional codes. Block codes generally involve an encoder that takes in blocks of k input bits and transform each block into n output bits. Such a code is thus referred to as a (n,k) block code. The rate of such a block code is typically defined as r=k/n.

Convolutional codes generally involve an encoder having a memory of M bits. Thus, a convolutional encoder may be viewed as having $2^M$ possible states. Each output bit of the convolutional encoder may be determined based on the memory of M bits and possibly one or more incoming bits. For example, an output bit may be generated by applying combinatorial logic to selected taps on the memory of M bits and one or more incoming bits. In other words, the output of a convolutional encoder may be determined based on the current state of the encoder and the incoming data. Also, more than one output bit may be generated in this manner each time new input bit(s) are shifted into the memory of M bits. The operation of a convolutional encoder may be represented by a trellis, as is well known in the art. The rate of a convolutional encoder that generates n output bits for every k input bits is typically defined as r=k/n.

There exists a variety of different block codes and convolutional codes. There also exists a variety of decoding algorithms for decoding the coded information in attempting to reconstruct the original data. For example, convolutional coding paired with Viterbi decoding is a popular FEC technique that is widely used in systems for transmitting data through channels affected by additive white Gaussian noise (AWGN).

Turbo codes and Turbo-like codes represent a relatively new and very powerful category of error correction codes. In the present disclosure, these codes and variations thereof are generally referred to as Turbo-like codes (TLC). A Turbo-like code generally involves the concatenation of two or more simple codes separated by an interleaver, combined with an iterative decoding strategy.

TLCs may provide significantly better coding gain compared to traditional FEC approaches. The coding gain may be as much as 3 decibels (dB) in many cases. That is, compared to a system using a traditional FEC code to achieve a certain performance level while operating at a particular noise level, a system using a TLC may be able to achieve the same performance level while operating at a noise level that is higher by 3 dB. The performance of such systems may be measured as bit error rate (BER), and the noise level may be measured as signal-to-noise ratio ($Eb/N_0$, expressed in dB), for instance.

FIG. 1 depicts a general curve of error probability performance versus signal-to-noise ratio that is characteristic of many TLCs. As shown, there is an initial steep reduction in error probability as $Eb/N_0$ is increased called the waterfall region, followed by a region of shallower reduction called the error floor region. The area where TLCs have traditionally excelled is in the waterfall region. Indeed, there exist TLCs that are within a small fraction of a dB of the Shannon limit in this region. However, many TLCs have an almost flat error floor region, or one that starts at a very high error rate, or both. This means that the coding gain of these TLCs rapidly diminishes as the target error rate is reduced. The performance of a TLC in the error floor region likely depends on many factors, such as the constituent code design and the interleaver design, but it typically worsens as the code rate increases or the frame size decreases. Thus many TLC designs only perform well at high error rates, or low code rates, or large frame sizes. Furthermore these designs often only target a single code rate, frame size, and modulation scheme, or suffer degraded performance or increased complexity to achieve flexibility in these areas.

A number of properties desirable in a Turbo-like code are described below. However, existing TLCs typically achieve only some of these desirable qualities, and do not consistently perform well in terms of these qualities across different environments.

Good threshold performance is desirable. That is, the waterfall region of a TLC's BER curve should occur at as low an $Eb/N_0$ as possible. This will minimize the energy expense of transmitting information. Good floor performance is also desirable. The error floor region of a TLC's BER curve should occur at a BER of as low as possible. For communication systems employing an automatic repeat-request (ARQ) scheme this may be as high as $10^{-6}$, while most broadcast communications systems demand $10^{-10}$ performance, and storage systems and optical fiber links require BERs as low as $10^{-15}$. Low complexity code constraints are desirable. To allow for low complexity decoders, particularly for high throughput applications, the constituent codes of the TLC should be simple. Furthermore, to allow the construction of high throughput decoders, the code structure should be such that parallel decoder architectures with simple routing and memory structures are possible. Fast decoder convergence is desirable. The decoder of a TLC code should converge rapidly (i.e. the number of iterations required to achieve most of the iteration gain should be low). This allows the construction of high throughput hardware decoders and/or low complexity software decoders. Code rate flexibility is also desirable. Most modern communications and storage systems do not operate at a single code rate. For example, in adaptive systems the code rate is adjusted according to the available SNR so that the code overheads are minimized. It should be possible to fine-tune the code rate to adapt to varying application requirements and channel conditions. Furthermore, this code rate flexibility should not come at the expense of degraded threshold or floor performance. Many systems demand code rates of 0.95 or above, which is typically very difficult to achieve for most TLCs. Frame size flexibility is desirable. Generally speaking the threshold and floor performance of TLCs are maximized by maximizing frame size. However, it is not always practical, for example, to have frames of many thousands of bits. Therefore it is desirable that a TLC still performs well with smaller frame size, as small as only one or two hundred bits for instance. Furthermore, modulation flexibility is desirable. In modern communication systems employing adaptive coding and modulation (ACM), for example, it is essential that the TLC easily support a broad range of modulation schemes.

Turbo-like codes (TLCs) include Parallel Concatenated Convolutional Codes (PCCC), which is often referred to as the classical Turbo code, Serially Concatenated Convolutional Codes (SCCC), Low Density Parity Check Codes (LDPC), and Turbo Product Codes (TPC). There have also been numerous variations on the basic TLC theme. FIGS. 2-5 present some basic encoder structures for these various TLCs. A brief description of different characteristics of each of these TLCs is provided below.

FIG. 2 is an illustrative block diagram of an encoder for a PCCC which involves the parallel concatenation of two convolutional codes. One encoder is fed the frame of information bits directly, while the other encoder is fed an interleaved version of the information bits. The encoded outputs of the two encoders are mapped to the signal set used on the channel. PCCCs generally have good threshold performance that is amongst the best threshold performance of all TLCs. However, PCCCs also generally have the worst floor performance of all TLCs. With 8-state constituent codes BER floors are typically in the range $10^{-6}$ to $10^{-8}$, but this can be reduced to the $10^{-8}$ to $10^{-10}$ range by using 16-state constituent codes. However, achieving floors below 10-10 may be difficult, particularly for high code rates and/or small frame sizes. There are PCCC variants that have improved floors, such as concatenating more than two constituent codes, but only at the expense of increased complexity. PCCCs have high complexity code constraints. With 8- or 16-state constituent codes the PCCC decoder complexity is rather high. PCCCs generally have fast convergence that is amongst the fastest of all TLCs. Typically only 4-8 iterations are required. PCCCs generally have fair code rate flexibility. Code rate flexibility is easily achieved by puncturing the outputs of the constituent codes, as is well known in the art. However, for very high code rates the amount of puncturing required is rather high, which degrades performance and increases decoder complexity. PCCCs have good frame size flexibility. The frame size may be modified by changing the size of the interleaver, and there exist many flexible interleaver algorithms that achieve good performance. PCCCs generally have good modulation flexibility. Systematic bits and the parity bits from each constituent code generally need to combined and mapped to the signal set.

FIG. 3 is an illustrative block diagram of an encoder for a SCCC which involves the serial concatenation of two convolutional codes. The outer encoder is fed the frame of information bits, and its encoded output is interleaved before being input to the inner encoder. The encoded outputs of only the inner encoder must be mapped to the signal set used on the channel. SCCCs generally have medium threshold performance. The threshold performance of SCCCs is typically 0.3 dB worse than PCCCs. SCCCs generally have good floor performance that is amongst the best of all TLCs. With SCCCs, it is possible to have BER floors in the range $10^{-8}$ to $10^{-10}$ with 4-state constituent codes, and below $10^{-10}$ with 8-state constituent codes. However floor performance is degraded with high code rates. SCCCs generally have medium complexity code constraints. Code complexity constraints are typically low, but are higher for high code rates. Also, constituent decoder complexity is higher than for the equivalent code in a PCCC because soft decisions of both systematic and parity bits must be formed. SCCCs generally have fast convergence. The convergence may be even faster than that of PCCCs, typically with 4-6 iterations required. However, SCCCs have poor code rate flexibility. As in the case of PCCCs, SCCCs typically accomplish rate flexibility by puncturing the outputs of the constituent encoders. However, due to the serial concatenation of constituent codes, the amount of puncturing is typically required to be higher for SCCCs than for PCCCs, for an equivalent overall code rate. SCCCs generally have good frame size flexibility. As in the case of PCCCs, SCCCs accomplish frame size flexibility by changing the size of the interleaver. However, for equivalent information frame sizes the interleaver of an SCCC is generally larger than that of a PCCC. Consequently, there is a complexity penalty in SCCCs for large frame sizes. Also, if the code rate is adjusted by puncturing the outer code then the interleaver size will depend on both the code rate and frame size, which complicates reconfigurability. Finally, SCCCs generally have very good modulation flexibility. This is because the inner code on an SCCC is connected directly to the channel it is relatively simple to map the bits into the signal set.

FIG. 4 is an illustrative block diagram of an encoder for a LDPC which involves block codes defined by a sparse parity check matrix. This sparseness admits a low complexity iterative decoding algorithm. The generator matrix corresponding to this parity check matrix can be determined, and used to encode a frame of information bits. These encoded bits must then be mapped to the signal set used on the channel, as shown in FIG. 4. LDPCs generally have good threshold performance. LDPCs have been reported that have threshold performance within a tiny fraction of a dB of the Shannon Limit. However, for practical decoders their threshold performance is usually comparable to that of PCCCs. LDPCs generally have medium floor performance. Floor performance for LDPCs are typically better than PCCCs, but worse than SCCCs. LDPCs generally have low complexity code constraints. In fact, LDPCs typically have the lowest complexity code constraints of all TLCs. However, high throughput LDPC decoders require large routing resources or inefficient memory architectures, which may dominate decoder complexity. Also, LPDC encoders are typically a lot more complex than other TLC encoders. LDPCs generally have slow convergence. LDPC decoders typically have the slowest convergence of all TLCs. Many published results are for 100 iterations or more. However, practical LDPC decoders will typically use 20-30 iterations. LDPCs generally have good code rate flexibility. However, LDPCs generally have poor frame size flexibility. For LDPCs to change frame size, they must change their parity check matrix, which may be quite difficult in a practical, high throughput decoder. LDPCs generally have good modulation flexibility. As in the case of PCCCs, output bits of LDPCs generally need to be mapped into signal sets of a modulation scheme.

FIG. 5 is an illustrative block diagram of an encoder for a TPC involving the arrangement of information bits as an array of equal length rows and equal length columns. The rows are encoded by one block code, and then the columns (including the parity bits generated by the first encoding) are encoded by a second block code. The encoded bits must then be mapped into the signal set of the channel. TPCs generally have poor threshold performance. In fact, TPCs typically have the worst threshold performance of all TLCs. TPCs can have thresholds that are as much as 1 dB worse than PCCCs. However, for very high code rates, e.g., 0.95 and above, they will typically outperform other TLCs. TPCs have medium floor performance. The floor performance of TPC is typically lower than that of PCCCs, but not as low as that of SCCCs. TPCs generally have low complexity code constraints. TPC decoders typically have the lowest complexity of all TLCs, and high throughput parallel decoders can readily be constructed. TPCs generally have medium convergence. TPC decoders typically require 8-16 iterations to converge. However, TPCs generally have poor rate flexibility. The overall rate of a TPC is typically dictated by the rate of its constituent codes. There is some flexibility available in these rates, but it is often very difficult to choose an arbitrary rate. TPCs also generally have poor frame size flexibility. The overall frame size of a TPC is also typically dictated by the frame size of its constituent codes. It is often difficult to choose an arbitrary frame size, and especially difficult to choose an arbitrary code rate and an arbitrary frame size. Finally, TPCs generally have good modulation flexibility. As in the case of PCCCs and LDPCs, output bits of TPCs generally need to be mapped into signal sets of a modulation scheme.

In the various TLCs described above, lack of flexibility is typically a serious concern. That is, high levels of performance is usually only achieved for a limited range of code rates, frame sizes, or modulation types. Operation outside of this limited range results in degraded performance or significantly increased complexity. Furthermore, it is more difficult to achieve high data throughputs with Turbo-like code decoders compared to decoders for more traditional FEC schemes. There is a demand in modern communication and storage systems for a very flexible error correction solution that does not compromise performance and can achieve high data throughputs.

BRIEF SUMMARY OF THE INVENTION

The present invention relates to methods, apparatuses, and systems for performing data encoding involving encoding data bits according to an outer convolutional code to produce outer encoded bits, processing the outer encoded bits using an interleaver and a single parity check (SPC) module to produce intermediate bits, encoding the intermediate bits according to an inner convolutional code to produce inner encoded bits, processing the inner encoded bits using a puncture module to produce punctured bits, and combining the data bits and the punctured bits to produce encoded outputs.

The SPC module may be capable of operating according to a configurable SPC rate, and the puncture module may be capable of operating according to a configurable puncture rate. An overall encoding rate is associated with converting the data bits into the encoded output, and the configurable SPC rate may correspond to a coarse rate control affecting the overall encoding rate, and the configurable puncture rate may correspond to a fine rate control affecting the overall encoding rate.

The present invention also relates to methods, apparatuses, and systems for performing data decoding involving obtaining soft channel metrics derived from a channel, separating the soft channel metrics into parity soft channel metrics and systematic soft channel metrics, processing the parity soft channel metrics using a de-puncture module to produce de-punctured parity soft channel metrics, and iteratively processing the de-punctured soft channel metrics and systematic soft channel metrics using an outer soft-input-soft-output (SISO) module, an inner SISO module, an single parity check (SPC) SISO module, an interleaver, and a de-interleaver to produce decoded soft outputs.

In one embodiment, the de-puncture module inserts, for each corresponding discarded bit, a parity channel metric associated with lack of channel metric information. The inserted parity channel metric may equal to zero. The decoded soft outputs may be hard-limited to produce decoded bits.

The present invention further relates to methods, apparatuses, and systems for performing decoding data involving obtaining soft channel metrics derived from a channel and related to an encoding process, the encoding process involving (a) an outer convolutional encoder, (b) an interleaver, (c) an inner convolutional encoder, (d) a single parity check (SPC) module operating according to a first SPC rate, and (e) a puncture module operating according to a first puncture rate, separating the soft channel metrics into parity soft channel metrics and systematic soft channel metrics, processing the parity soft channel metrics using a de-puncture module to produce de-punctured parity soft channel metrics, iteratively processing the de-punctured soft channel metrics and systematic soft channel metrics using an outer soft-input-soft-output (SISO) module, an inner SISO module, an single parity check (SPC) SISO module, an interleaver, and a de-interleaver to produce decoded soft outputs, wherein the de-puncture module operates according to a second puncture rate different from the first puncture rate, and wherein the SPC SISO module operates according to a second SPC rate different from the first SPC rate.

The present invention further relates to methods, apparatuses, and systems for decoding data by utilizing a decoder structure containing a plurality of variable nodes and a plurality of check nodes and iteratively passing messages between the variable nodes and the check nodes to improve metrics on the data being decoded. The methods, apparatuses, and systems involve obtaining soft channel metrics derived from a channel and related to an encoding process, the encoding process involving (a) an outer convolutional encoder, (b) an interleaver, (c) an inner convolutional encoder, and (d) a single parity check (SPC) module, wherein both the outer convolutional encoder and inner convolutional encoder are binary, linear, 2-state encoders; sending the soft channel metrics to a first group of variable nodes in the plurality of variable nodes, and iteratively passing messages between the plurality of variable nodes and the plurality of check nodes through the at least one permutation module to improve metrics on the data being decoded.

In one embodiment, the second group of variable nodes includes variable nodes for processing metrics corresponding to outputs of the outer convolutional encoder. In one embodiment, the encoding process further involves a puncture module, and the second group of variable nodes includes variables for processing metrics corresponding to inputs of the puncture module.

DETAILED DESCRIPTION OF THE INVENTION

Encoder

Figure 1:
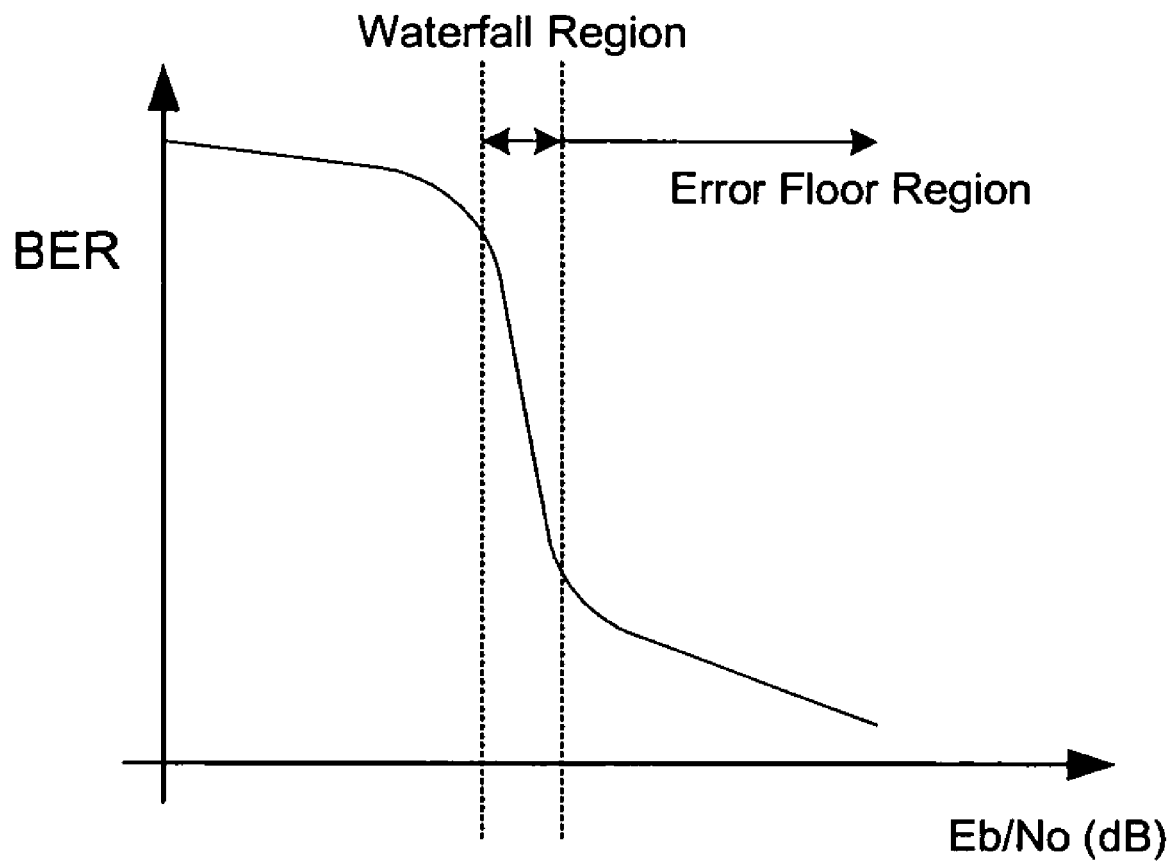
FIG. 1 depicts a general curve of error probability performance versus signal-to-noise ratio that is characteristic of many TLCs.
Figure 2:
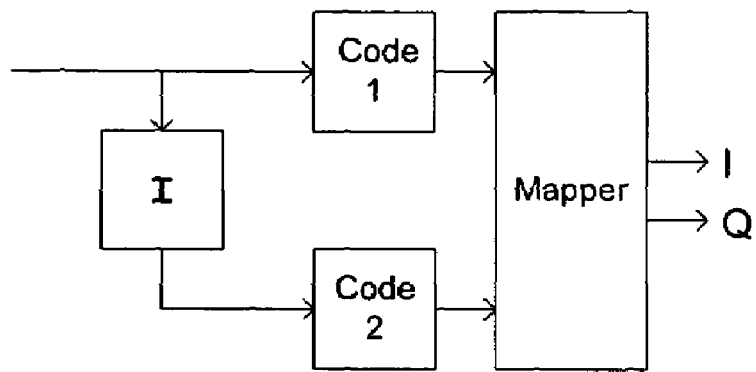
FIG. 2 is an illustrative block diagram of an encoder for a PCCC which involves the parallel concatenation of two convolutional codes.
Figure 3:
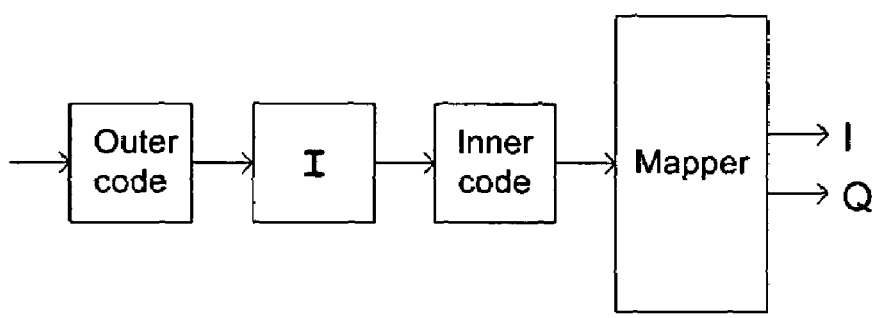
FIG. 3 is an illustrative block diagram of an encoder for a SCCC which involves the serial concatenation of two convolutional codes.
Figure 4:
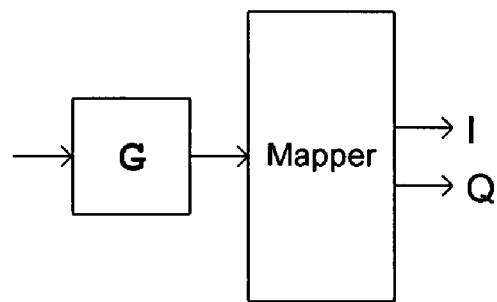
FIG. 4 is an illustrative block diagram of an encoder for a LDPC which involves block codes defined by a sparse parity check matrix.
Figure 5:
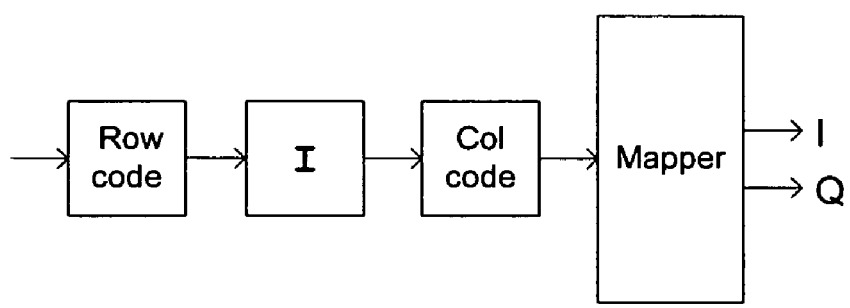
FIG. 5 is an illustrative block diagram of an encoder for a TPC involving the arrangement of information bits as an array of equal length rows and equal length columns.
Figure 6:
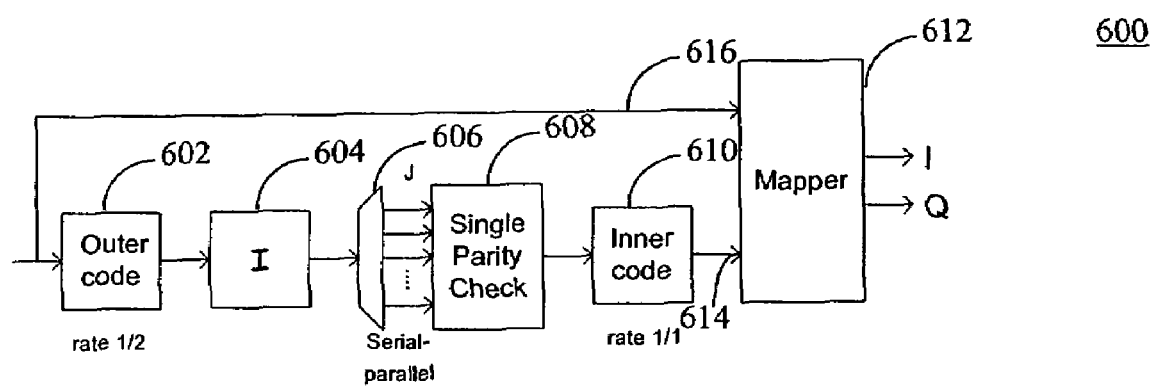
FIG. 6 is an illustrative block diagram of an encoder 600 for an improved error correction coding scheme according to one embodiment of the present invention.

FIG. 6 is an illustrative block diagram of an encoder 600 for an improved error correction coding scheme according to one embodiment of the present invention. Here, encoder 600 comprises an outer code module 602, an interleaver 604, a serial to parallel converter 606, a single parity check (SPC) module 608, an inner code module 610, and a mapper 612. As shown in the figure, encoder 600 generates a systematic code. In other words, both the encoded bits generated from the input bits, as well as the input bits themselves, are sent through the channel. The channel as described here broadly refers to a medium of data transmission or data storage that potentially introduces errors in the data.

As shown in the figure, input bits are first encoded by outer code module 602. In this example, outer code module 602 implements a rate 1/2 convolutional code with a time-varying trellis. In other words, the trellis that represents the behavior of this convolutional encoder has a structure that can vary with time. For example, such a trellis can change from one structure to another structure each time one or more input bits are processed. These different structures are referred to here as trellis sections. A time-varying trellis may change its structure, from a first trellis section, to a second trellis section, to a third trellis section, and so on, until it reaches an $N^{th}$ trellis section. The trellis may then change back to the first trellis section and repeat through the same set of trellis sections. Such a set of trellis sections is referred to here as a trellis pattern. Details of the operation of time-varying trellises are known in the art. Referring back to FIG. 6, the trellis sections that make up the trellis pattern associated with outer code module 602 can be mixed and matched to form different trellis patterns, in order optimize threshold performance, floor performance, and/or other criteria.

In one embodiment, output code module 602 represents a 4-state outer code. In another embodiment, a 2-state outer code is used, which may be less complex but may be associated with higher floors. In yet another embodiment, an 8-state outer code is used, which may be more complex but may be associated with lower floors. The number of states of the outer code may thus vary and may be chosen to optimize performance. For example, a 4-state outer code may provide a desirable balance between floor height and complexity, and may provide a floor below a BER of $10^{-10}$ in certain implementations.

According to one embodiment of the invention, interleaver 604 interleaves the results of outer code module 602. As shown, outer code module 602 has a serial output, and interleaver 604 has a serial input as well. Thus, no serial-to-parallel or parallel-to-serial conversion is necessary. This may not always be the case in other implementations. For example, if outer code module 602 has a parallel output, and interleaver 604 has a serial input, a parallel-to-serial conversion unit (not shown) may be used to convert the data from parallel form to serial form, before being supplied to interleaver 604. Other variations may be possible, and appropriate serial-to-parallel or parallel-to-serial conversions may be utilized, as is known in the art.

According to one embodiment of the invention, if the outer code rate is 1/2, the length of interleaver 604 may be 2K bits, where K is the size of the input data frame in bits. In other words, for every K input bits, outer code module 602 may generate 2K encoded bits, and interleaver 604 may perform interleaving based on a length of 2K bits. In the present embodiment of the invention, encoder 600 allows K to be a programmable value, as opposed to a fixed value. Accordingly, interleaver 606 may be a variable length interleaver. Different designs of variable length interleavers are well known in the art.

Serial to parallel converter 606 transforms the output of interleaver 604 from serial form to parallel form. Specifically, the bits from interleaver 604 are grouped into groups of J bits. Here, K and J may be different values. However, it is possible in certain implementations that K and J may be the same value. The output of serial to parallel converter 606 is provided to single parity check module 608.

Single parity check (SPC) module 608 receives the groups of J bits and outputs a single bit for each group of J bits. In the present embodiment of the invention, the single bit is generated as the modulo-2 sum of the J bits. For example, the single bit may be implemented in combinatorial logic as the exclusive OR (XOR) of the J bits. Thus, the single bit takes into account each of the J bits from which it is generated. In the present embodiment of the invention, encoder 600 allows J to be a programmable value, as opposed to a fixed value. As can be seen from FIG. 6, the overall coding rate of encoder 600 may be expressed as J/(J+2).

By varying the value of J, encoder 600 can be configured to produce a wide variety of coding rates. Importantly, this rate flexibility is achieved while desirable code performance is maintained. By contrast, for instance, an SCCC code offers rate flexibility at a cost of decreased code performance. An SCCC code utilizes a puncture circuit to achieve rate flexibility. Such a puncture circuit keeps one bit out of every J bits and discards the rest of the bits. The SPC circuit utilized in accordance with the present embodiment of the invention combines J bits to produce one bit and achieves superior results in terms of a larger minimum distance and lower floors.

Inner code module 610 encodes the data received from SPC module 608. In this example, inner code module 610 implements a rate 1/1 convolutional code with a time varying trellis. Again, the trellis sections of this code can be mixed and matched to optimize threshold performance, floor performance, and/or other criteria. In one embodiment, inner code module 610 represents a 4-state inner code. In another embodiment, a 2-state inner code is be used, which may be less complex but may be associated with higher floors. In yet another embodiment, an 8-state inner code is used, which may be more complex but may be associated with lower floors. The number of states of the outer code may thus vary and may be chosen to optimize performance. For example, a 4-state inner code may provide a desirable balance between floor height and complexity, and may provide a floor below a BER of $10^{-10}$ in certain implementations. Here, the inner code needs to only operate once for every J/2 times the outer code operates, which reduces complexity.

Mapper 612 receives the output of inner code module 610, which may be referred to as "parity" data. Mapper 612 also receives the original input data, which may be referred to as "systematic" data. Here, mapper 612 represents a flexible mapper circuit that can take the parity data stream 614 and systematic data stream 616 and map them into a format suitable for sending through the channel. In one embodiment of the invention, mapper 612 selectively applies Gray code mapping and generates different types of modulation signals based on the parity and systematic data streams. For example, the modulations signals may include binary phase shift keying (BPSK), quadrature phase shift keying (QPSK), 8-ary phase shift keying (8PSK), 16 quadrature amplitude modulation (16QAM), and 16 amplitude and phase shift keying (16APSK). As is known in the art, other types of modulation and variations thereof may also be used.

Specific Example of Encoder

Below is a detailed description of a specific example of an encoder that flexibly performs encoding for different data frame sizes, coding rates, and modulations, in accordance with one embodiment of the invention. The structure presented previously as encoder 600 is utilized again for illustrative purposes. Here, the encoder may operate with eight default frame sizes ranging from 128 bits to 16384 bits, as listed below. Each data frame refers to a collection of data organized as a group for processing.

- 128 bits;
- 256 bits;
- 512 bits;
- 1024 bits;
- 2048 bits;
- 4096 bits;
- 8192 bits; and
- 16384 bits.

These data frame sizes are presented for illustrative purpose. Other sizes may also be adopted. In accordance with one embodiment of the invention, the encoder may be reprogrammed to support different sets of frame sizes. For example, the encoder may be reprogrammed to support another set of eight different frame sizes. Also, the encoder may allow the frame size to be selected from the available sizes on a frame-by-frame basis.

Here, the encoder supports eight different code rates, as listed below. These code rates are presented for illustrative purposes. Other code rates may also be used in accordance with the present invention. The encoder may also allow the code rate to be selectable on a frame-by-frame basis.

- 1/2;
- 2/3;
- 3/4;
- 4/5;
- 5/6;
- 7/8;

8/9; and

19/20.

The encoder may optionally output a coded bit stream directly, or map the bit stream onto user specified modulation symbols. The possible mappings in this example are:

BPSK;
QPSK;
8PSK;
16QAM; and
16APSK

These mappings are presented for illustrative purposes. Other mappings may also be adopted in accordance with the invention. In one embodiment, other mappings may be supported by using BPSK or QPSK mode and performing the mapping externally.

Referring back to FIG. 6, encoder 600 may utilize an outer code module 602 that implements a rate 2/4 4-state convolutional code with a time varying trellis. There are K input bits to the outer encoder, and 2K output bits. The input bits are considered as pairs of bits and are labeled $\{b_0^1 b_0^2 b_1^1 b_1^2 \ldots b_k^1 b_{k2} \ldots b_{K/2-1}^1 b_{K/2-1}^2\}$. The output bits are considered as quadruples of 4 bits and are labeled $\{c_0^1 c_0^2 c_0^3 c_0^4 c_1^1 c_1^2 c_1^3 c_1^4 \ldots c_k^1 c_k^2 c_k^3 c_k^4 \ldots c_{K/2-1}^1 c_{K/2-1}^2 c_{K/2-1}^3 c_{K/2-1}^4\}$. The first bit in each set corresponds to the earliest bit in time.

Outer code module 602 utilizes a time-vary trellis. There are 15 different trellis sections used in the outer code, each corresponding to a pair of input bits, and these are described in Table 1 to Table 15. In these tables all combinations of current state and input pairs are given, along with the corresponding output quadruple and next state.

TABLE 1

Outer Trellis Section Number 0

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1100 | 1 |
| 0 | 01 | 0011 | 2 |
| 0 | 11 | 1111 | 3 |
| 1 | 00 | 0100 | 0 |
| 1 | 10 | 1000 | 1 |
| 1 | 01 | 0111 | 2 |
| 1 | 11 | 1011 | 3 |
| 2 | 00 | 0001 | 0 |
| 2 | 10 | 1101 | 1 |
| 2 | 01 | 0010 | 2 |
| 2 | 11 | 1110 | 3 |
| 3 | 00 | 0101 | 0 |
| 3 | 10 | 1001 | 1 |
| 3 | 01 | 0110 | 2 |
| 3 | 11 | 1010 | 3 |

TABLE 2

Outer Trellis Section Number 1

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 0100 | 0 |
| 1 | 10 | 1001 | 1 |
| 1 | 01 | 0111 | 2 |
| 1 | 11 | 1010 | 3 |
| 2 | 00 | 0001 | 0 |
| 2 | 10 | 1100 | 1 |
| 2 | 01 | 0010 | 2 |
| 2 | 11 | 1111 | 3 |
| 3 | 00 | 0101 | 0 |
| 3 | 10 | 1000 | 1 |
| 3 | 01 | 0110 | 2 |
| 3 | 11 | 1011 | 3 |

TABLE 3

Outer Trellis Section Number 2

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 0100 | 0 |
| 1 | 10 | 1001 | 1 |
| 1 | 01 | 0111 | 2 |
| 1 | 11 | 1010 | 3 |
| 2 | 00 | 0011 | 0 |
| 2 | 10 | 1110 | 1 |
| 2 | 01 | 0000 | 2 |
| 2 | 11 | 1101 | 3 |
| 3 | 00 | 0111 | 0 |
| 3 | 10 | 1010 | 1 |
| 3 | 01 | 0100 | 2 |
| 3 | 11 | 1001 | 3 |

TABLE 4

Outer Trellis Section Number 3

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1100 | 1 |
| 0 | 01 | 0011 | 2 |
| 0 | 11 | 1111 | 3 |
| 1 | 00 | 0100 | 0 |
| 1 | 10 | 1000 | 1 |
| 1 | 01 | 0111 | 2 |
| 1 | 11 | 1011 | 3 |
| 2 | 00 | 0101 | 0 |
| 2 | 10 | 1001 | 1 |
| 2 | 01 | 0110 | 2 |
| 2 | 11 | 1010 | 3 |
| 3 | 00 | 0001 | 0 |
| 3 | 10 | 1101 | 1 |
| 3 | 01 | 0010 | 2 |
| 3 | 11 | 1110 | 3 |

TABLE 5

Outer Trellis Section Number 4

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |

TABLE 5-continued

Outer Trellis Section Number 4

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 1 | 00 | 0100 | 0 |
| 1 | 10 | 1001 | 1 |
| 1 | 01 | 0111 | 2 |
| 1 | 11 | 1010 | 3 |
| 2 | 00 | 0101 | 0 |
| 2 | 10 | 1000 | 1 |
| 2 | 01 | 0110 | 2 |
| 2 | 11 | 1011 | 3 |
| 3 | 00 | 0001 | 0 |
| 3 | 10 | 1100 | 1 |
| 3 | 01 | 0010 | 2 |
| 3 | 11 | 1111 | 3 |

TABLE 6

Outer Trellis Section Number 5

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 0100 | 0 |
| 1 | 10 | 1001 | 1 |
| 1 | 01 | 0111 | 2 |
| 1 | 11 | 1010 | 3 |
| 2 | 00 | 0111 | 0 |
| 2 | 10 | 1010 | 1 |
| 2 | 01 | 0100 | 2 |
| 2 | 11 | 1001 | 3 |
| 3 | 00 | 0011 | 0 |
| 3 | 10 | 1110 | 1 |
| 3 | 01 | 0000 | 2 |
| 3 | 11 | 1101 | 3 |

TABLE 7

Outer Trellis Section Number 6

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1100 | 1 |
| 0 | 01 | 0011 | 2 |
| 0 | 11 | 1111 | 3 |
| 1 | 00 | 1100 | 0 |
| 1 | 10 | 0000 | 1 |
| 1 | 01 | 1111 | 2 |
| 1 | 11 | 0011 | 3 |
| 2 | 00 | 0101 | 0 |
| 2 | 10 | 1001 | 1 |
| 2 | 01 | 0110 | 2 |
| 2 | 11 | 1010 | 3 |
| 3 | 00 | 1001 | 0 |
| 3 | 10 | 0101 | 1 |
| 3 | 01 | 1010 | 2 |
| 3 | 11 | 0110 | 3 |

TABLE 8

Outer Trellis Section Number 7

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 1100 | 0 |
| 1 | 10 | 0001 | 1 |
| 1 | 01 | 1111 | 2 |
| 1 | 11 | 0010 | 3 |
| 2 | 00 | 0101 | 0 |
| 2 | 10 | 1000 | 1 |
| 2 | 01 | 0110 | 2 |
| 2 | 11 | 1011 | 3 |
| 3 | 00 | 1001 | 0 |
| 3 | 10 | 0100 | 1 |
| 3 | 01 | 1010 | 2 |
| 3 | 11 | 0111 | 3 |

TABLE 9

Outer Trellis Section Number 8

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1101 | 1 |
| 0 | 01 | 0011 | 2 |
| 0 | 11 | 1110 | 3 |
| 1 | 00 | 1100 | 0 |
| 1 | 10 | 0001 | 1 |
| 1 | 01 | 1111 | 2 |
| 1 | 11 | 0010 | 3 |
| 2 | 00 | 0111 | 0 |
| 2 | 10 | 1010 | 1 |
| 2 | 01 | 0100 | 2 |
| 2 | 11 | 1001 | 3 |
| 3 | 00 | 1011 | 0 |
| 3 | 10 | 0110 | 1 |
| 3 | 01 | 1000 | 2 |
| 3 | 11 | 0101 | 3 |

TABLE 10

Outer Trellis Section Number 9

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1110 | 1 |
| 0 | 01 | 0001 | 2 |
| 0 | 11 | 1111 | 3 |
| 1 | 00 | 0110 | 0 |
| 1 | 10 | 1000 | 1 |
| 1 | 01 | 0111 | 2 |
| 1 | 11 | 1001 | 3 |
| 2 | 00 | 0010 | 0 |
| 2 | 10 | 1100 | 1 |
| 2 | 01 | 0011 | 2 |
| 2 | 11 | 1101 | 3 |
| 3 | 00 | 0100 | 0 |

TABLE 10-continued

Outer Trellis Section Number 9

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 3 | 10 | 1010 | 1 |
| 3 | 01 | 0101 | 2 |
| 3 | 11 | 1011 | 3 |

TABLE 11

Outer Trellis Section Number A

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1110 | 1 |
| 0 | 01 | 0001 | 2 |
| 0 | 11 | 1111 | 3 |
| 1 | 00 | 0110 | 0 |
| 1 | 10 | 1000 | 1 |
| 1 | 01 | 0111 | 2 |
| 1 | 11 | 1001 | 3 |
| 2 | 00 | 0011 | 0 |
| 2 | 10 | 1101 | 1 |
| 2 | 01 | 0010 | 2 |
| 2 | 11 | 1100 | 3 |
| 3 | 00 | 0101 | 0 |
| 3 | 10 | 1011 | 1 |
| 3 | 01 | 0100 | 2 |
| 3 | 11 | 1010 | 3 |

TABLE 12

Outer Trellis Section Number B

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1111 | 1 |
| 0 | 01 | 0001 | 2 |
| 0 | 11 | 1110 | 3 |
| 1 | 00 | 0110 | 0 |
| 1 | 10 | 1001 | 1 |
| 1 | 01 | 0111 | 2 |
| 1 | 11 | 1000 | 3 |
| 2 | 00 | 0011 | 0 |
| 2 | 10 | 1100 | 1 |
| 2 | 01 | 0010 | 2 |
| 2 | 11 | 1101 | 3 |
| 3 | 00 | 0101 | 0 |
| 3 | 10 | 1010 | 1 |
| 3 | 01 | 0100 | 2 |
| 3 | 11 | 1011 | 3 |

TABLE 13

Outer Trellis Section Number C

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1001 | 1 |
| 0 | 01 | 0111 | 2 |
| 0 | 11 | 1110 | 3 |
| 1 | 00 | 0000 | 0 |
| 1 | 10 | 1001 | 1 |
| 1 | 01 | 0111 | 2 |
| 1 | 11 | 1110 | 3 |

TABLE 13-continued

Outer Trellis Section Number C

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 2 | 00 | 0011 | 0 |
| 2 | 10 | 1010 | 1 |
| 2 | 01 | 0100 | 2 |
| 2 | 11 | 1101 | 3 |
| 3 | 00 | 0011 | 0 |
| 3 | 10 | 1010 | 1 |
| 3 | 01 | 0100 | 2 |
| 3 | 11 | 1101 | 3 |

TABLE 14

Outer Trellis Section Number D

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1001 | 1 |
| 0 | 01 | 0111 | 2 |
| 0 | 11 | 1110 | 3 |
| 1 | 00 | 1000 | 0 |
| 1 | 10 | 0001 | 1 |
| 1 | 01 | 1111 | 2 |
| 1 | 11 | 0110 | 3 |
| 2 | 00 | 0011 | 0 |
| 2 | 10 | 1010 | 1 |
| 2 | 01 | 0100 | 2 |
| 2 | 11 | 1101 | 3 |
| 3 | 00 | 1011 | 0 |
| 3 | 10 | 0010 | 1 |
| 3 | 01 | 1100 | 2 |
| 3 | 11 | 0101 | 3 |

TABLE 15

Outer Trellis Section Number E

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1001 | 1 |
| 0 | 01 | 0111 | 2 |
| 0 | 11 | 1110 | 3 |
| 1 | 00 | 1000 | 0 |
| 1 | 10 | 0001 | 1 |
| 1 | 01 | 1111 | 2 |
| 1 | 11 | 0110 | 3 |
| 2 | 00 | 1011 | 0 |
| 2 | 10 | 0010 | 1 |
| 2 | 01 | 1100 | 2 |
| 2 | 11 | 0101 | 3 |
| 3 | 00 | 0011 | 0 |
| 3 | 10 | 1010 | 1 |
| 3 | 01 | 0100 | 2 |
| 3 | 11 | 1101 | 3 |

In the present example, these trellis sections are combined together in 16 different trellis patterns, each consisting of 16 trellis sections. The 16 default trellis patterns are shown in Table 16. According to one embodiment of the invention, encoder 600 allows these trellis patterns to be reprogrammed.

The first trellis section in each trellis pattern is used as the first trellis section in the frame, followed by the second trellis section, and so on. The different trellis patterns offer different trade-offs in terms of performance, such as in terms of threshold performance and floor performance. In this particular example, Trellis pattern number 0 likely provides the best threshold performance but the worst floor performance. As the trellis pattern number increases the threshold performance tends to worsen and the floor performance tends to improve. Trellis pattern number 15 likely provides the worst threshold performance but the best floor performance.

TABLE 16

Outer Trellis Patterns

| Trellis Pattern Number | Trellis Pattern |
|---|---|
| 0 | CBCBCBCBCBCBCBCB |
| 1 | 4444444444444444 |
| 2 | 1111111111111111 |
| 3 | 3030303030303030 |
| 4 | 0000000000000000 |
| 5 | 7777777777777777 |
| 6 | 0600060006000600 |
| 7 | 2020202020202020 |
| 8 | 2200220022002200 |
| 9 | 0222022202220222 |
| 10 | 2222222222222222 |
| 11 | 5858585858585858 |
| 12 | 2828282828282828 |
| 13 | 8588858885888588 |
| 14 | 8288828882888288 |
| 15 | 8888888888888888 |

Default outer encoder trellis patterns for each mode are shown in Table 17 to Table 20. As mentioned previously, encoder 600 may allow these trellis patterns to be reprogrammed. The default trellis patterns shown in Table 17 to Table 20 have been selected to provide superior threshold performance with a floor below a BER of $10^{-10}$.

TABLE 17

Outer Trellis Patterns for BPSK/QPSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 11 | 12 | 13 | 11 | 14 | 14 | 14 | 14 |
| 256 | 14 | 12 | 11 | 12 | 14 | 14 | 14 | 14 |
| 512 | 14 | 12 | 11 | 12 | 14 | 14 | 14 | 14 |
| 1024 | 12 | 10 | 10 | 13 | 14 | 15 | 15 | 15 |
| 2048 | 11 | 6 | 13 | 10 | 14 | 15 | 15 | 15 |
| 4096 | 7 | 5 | 7 | 7 | 11 | 10 | 10 | 15 |
| 8192 | 3 | 2 | 6 | 7 | 10 | 13 | 15 | 15 |
| 16384 | 7 | 3 | 8 | 6 | 9 | 11 | 12 | 14 |

TABLE 18

Outer Trellis Patterns for 8PSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 14 | 11 | 13 | 12 | 14 | 14 | 14 | 14 |
| 256 | 14 | 12 | 12 | 11 | 12 | 14 | 14 | 14 |
| 512 | 14 | 12 | 12 | 11 | 14 | 14 | 14 | 14 |
| 1024 | 11 | 8 | 10 | 7 | 14 | 14 | 15 | 15 |
| 2048 | 13 | 6 | 9 | 11 | 14 | 14 | 15 | 15 |
| 4096 | 8 | 8 | 8 | 11 | 11 | 12 | 13 | 15 |
| 8192 | 3 | 3 | 7 | 9 | 10 | 13 | 15 | 15 |
| 16384 | 4 | 3 | 4 | 6 | 9 | 10 | 12 | 15 |

TABLE 19

Outer Trellis Patterns for 16QAM

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 14 | 14 | 14 | 14 | 11 | 11 | 11 | 8 |
| 256 | 14 | 12 | 12 | 13 | 14 | 14 | 14 | 14 |
| 512 | 14 | 12 | 12 | 11 | 11 | 14 | 14 | 14 |
| 1024 | 11 | 6 | 10 | 8 | 14 | 13 | 14 | 15 |
| 2048 | 13 | 9 | 11 | 13 | 14 | 15 | 15 | 15 |
| 4096 | 7 | 6 | 4 | 6 | 11 | 11 | 11 | 15 |
| 8192 | 7 | 3 | 6 | 9 | 11 | 11 | 15 | 15 |
| 16384 | 7 | 2 | 5 | 6 | 9 | 8 | 9 | 12 |

TABLE 20

Outer Trellis Patterns for 16APSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 13 | 11 | 13 | 8 | 11 | 11 | 11 | 8 |
| 256 | 14 | 12 | 12 | 14 | 14 | 14 | 14 | 14 |
| 512 | 14 | 12 | 12 | 13 | 14 | 14 | 13 | 14 |
| 1024 | 11 | 6 | 11 | 13 | 13 | 14 | 14 | 15 |
| 2048 | 13 | 11 | 9 | 13 | 14 | 15 | 15 | 15 |
| 4096 | 8 | 4 | 6 | 4 | 9 | 11 | 14 | 15 |
| 8192 | 7 | 3 | 7 | 8 | 9 | 11 | 15 | 15 |
| 16384 | 7 | 3 | 7 | 6 | 9 | 12 | 12 | 15 |

According to one embodiment, tail biting termination is used in the outer encoder. Specifically, the first two bits of the frame are used to initialize the encoder state: $S_0 = 2b_0^2 + b_0^1$. Nothing is output during this time and these first two bits are stored. Then, once the end of the frame is reached, the first two bits are again input into the encoder and outputs generated. This returns the encoder to the same state as the initial state.

Referring again to FIG. 6, interleaver 604 performs interleaving on the output of outer code module 602. In this example, the interleaver block length is twice the data frame size. According to one embodiment of the invention, the interleaver block length is programmable, and the interleaver uses a Dithered Relative Prime (DRP) algorithm, which is well known. Here, the inputs to the interleaver are divided into groups of 64 bits, and the bits in each group are permuted within the group using the same permutation for each group (referred to as the input dither). If $v_{in}$ is a vector that represents the bits input to the interleaver ($v_{in}(i)$ is the ith bit into the interleaver) then the output of the input dither circuit is:

$$v_a(i)=v_{in}(I_a(i)),$$

where $$I_a(i)=64\lfloor i/64 \rfloor + r(i \bmod 64).$$

r(i) is the input dither pattern and is defined in Table 21. Here, the input dither pattern is the same for all modes. Bits at the output of the input dither circuit are interleaved in a relative prime fashion. The output of the relative prime interleaver circuit is:

$$v_b(i)=v_a(I_b(i))$$

where $$I_b(i)=(s+ip) \bmod (2K)$$

and K is the number of information bits in the frame. The default relative prime interleaver parameters are varied according to the frame size, and are given in Table 22. According to one embodiment of the invention, encoder 600 allows the prime interleaver parameters to be reprogrammed. The output bits of the relative prime interleaver are again grouped into groups of 64 bits and permuted according to the output dither. The output of the output dither circuit, which may be the final output of the interleaver circuit, is:

$$v_{out}(i)=v_b(I_c(i))$$

where $$I_c(i)=64\lfloor i/64 \rfloor + w(i \bmod 64)$$

w(i) is the output dither pattern and is varied according to the frame size. The output dither pattern is defined in Table 21.

TABLE 21

Input and Output Dither Patterns

| K | Dither | Pattern |
|---|---|---|
| All | r | (42, 34, 55, 47, 15, 7, 10, 50, 21, 63, 22, 26, 3, 40, 14, 38, 4, 39, 60, 32, 11, 57, 56, 18, 44, 54, 23, 58, 1, 12, 62, 31, 29, 48, 28, 13, 41, 52, 53, 33, 43, 20, 17, 36, 27, 35, 30, 5, 6, 46, 37, 45, 9, 24, 59, 8, 25, 19, 49, 61, 16, 2, 0, 51) |
| 128 | w | (38, 60, 59, 0, 40, 25, 29, 26, 9, 24, 1, 42, 37, 13, 62, 49, 3, 30, 23, 45, 36, 32, 18, 8, 50, 51, 5, 47, 31, 53, 21, 4, 58, 17, 6, 43, 14, 19, 12, 41, 7, 34, 63, 11, 55, 44, 35, 27, 54, 28, 20, 46, 61, 57, 2, 39, 56, 33, 22, 16, 52, 15, 48, 10) |
| 256 | w | (54, 40, 29, 20, 12, 39, 19, 50, 55, 28, 31, 34, 43, 35, 62, 47, 53, 30, 17, 3, 32, 52, 26, 44, 58, 5, 11, 25, 41, 27, 59, 0, 18, 15, 22, 45, 46, 37, 24, 23, 33, 10, 9, 13, 49, 56, 21, 61, 38, 8, 48, 14, 51, 7, 42, 1, 60, 63, 6, 4, 16, 57, 36, 2) |
| 512 | w | (4, 54, 11, 34, 26, 21, 1, 0, 37, 42, 13, 48, 25, 17, 12, 29, 35, 44, 63, 49, 46, 2, 40, 58, 8, 51, 57, 7, 23, 9, 41, 14, 32, 61, 36, 27, 60, 19, 38, 5, 15, 24, 55, 59, 31, 6, 3, 43, 52, 22, 62, 28, 33, 53, 56, 47, 10, 45, 20, 18, 30, 39, 50, 16) |
| 1024 | w | (61, 23, 16, 51, 11, 34, 62, 41, 50, 27, 58, 25, 54, 14, 37, 10, 8, 5, 20, 46, 47, 19, 49, 43, 17, 24, 22, 60, 12, 38, 6, 15, 9, 42, 29, 32, 21, 56, 7, 18, 36, 33, 44, 0, 52, 39, 40, 48, 45, 55, 63, 53, 30, 2, 1, 4, 59, 26, 13, 35, 31, 28, 3, 57,) |
| 2048 | w | (56, 30, 5, 2, 42, 51, 23, 12, 35, 26, 27, 28, 31, 7, 16, 11, 13, 48, 1, 39, 6, 34, 4, 10, 36, 61, 63, 25, 9, 47, 15, 38, 44, 43, 24, 53, 32, 29, 46, 3, 49, 20, 41, 21, 33, 14, 45, 37, 8, 62, 54, 0, 55, 19, 52, 17, 58, 59, 40, 18, 22, 57, 50, 60,) |
| 4096 | w | (5, 23, 60, 3, 59, 38, 18, 1, 54, 11, 30, 49, 42, 34, 13, 46, 20, 45, 48, 2, 15, 35, 41, 27, 9, 36, 10, 56, 8, 26, 58, 47, 33, 14, 37, 12, 61, 4, 7, 22, 0, 25, 40, 44, 16, 39, 52, 28, 53, 55, 31, 29, 50, 6, 57, 32, 43, 62, 21, 51, 63, 24, 19, 17,) |
| 8192 | w | (37, 55, 60, 35, 27, 38, 18, 33, 54, 43, 30, 17, 42, 34, 45, 46, 20, 13, 48, 2, 47, 3, 9, 59, 41, 36, 10, 56, 8, 26, 58, 15, 1, 14, 5, 12, 29, 4, 39, 22, 0, 57, 40, 44, 16, 7, 52, 28, 21, 23, 63, 61, 50, 6, 25, 32, 11, 62, 53, 19, 31, 24, 51, 49,) |
| 16384 | w | (41, 35, 44, 63, 23, 30, 58, 21, 46, 39, 54, 5, 50, 10, 17, 6, 36, 49, 48, 42, 59, 31, 29, 55, 61, 52, 18, 24, 40, 34, 2, 27, 53, 38, 9, 60, 1, 20, 19, 14, 0, 13, 8, 28, 16, 51, 4, 12, 25, 3, 11, 33, 26, 62, 45, 32, 7, 22, 57, 47, 43, 56, 15, 37,) |

TABLE 22

Relative Prime Interleaver Parameters

| K | p | s |
|---|---|---|
| 128 | 113 | 41 |
| 256 | 51 | 45 |
| 512 | 275 | 35 |
| 1024 | 967 | 4 |
| 2048 | 2201 | 55 |
| 4096 | 2531 | 0 |
| 8192 | 9539 | 0 |
| 16384 | 9239 | 0 |

Serial to parallel converter 606 transforms the output of interleaver 604 from serial form to parallel form. Specifically, the bits from interleaver 604 are grouped into groups of J bits and input to single parity check (SPC) module 608.

SPC module 608 performs a single parity check operation on each group of J input bits. According to one embodiment of the invention, SPC module 608 is implemented as a circuit that exclusive-ORs the J bits together to generate a single output bit for every group of J input bits. Here, the value of J is programmable and controls the overall rate of the code associated with encoder 600. As mentioned previously, this overall rate of the code is approximately J/(J+2). The J values used in each rate are shown in Table 23. In one embodiment, if the number of bits from the interleaver are not divisible by J, the remaining bits (<J) are simply exclusive-ORed together to form the final output bit of the SPC module 608.

TABLE 23

Values of J for each code rate

| Rate | J |
|---|---|
| 1/2 | 2 |
| 2/3 | 4 |
| 3/4 | 6 |
| 4/5 | 8 |
| 5/6 | 10 |
| 7/8 | 14 |
| 8/9 | 16 |
| 19/20 | 38 |

Inner code module 610 encodes the data received from SPC module 608. Here, the inner encoder is a rate 1/1, 4-state convolutional code with a time varying trellis. There are L input bits to the inner encoder, and L output bits. The input bits are considered as pairs of bits and are labeled $\{d_0^1 d_0^2 d_1^1 d_1^2 \ldots d_{k1} d_k^2 \ldots d_{L/2-1}^1 d_{L/2-1}^2\}$. The output bits are considered as pairs of bits and are labeled $\{p_0^1 p_0^2 p_1^1 p_1^2 \ldots p_l^1 p_l^2 \ldots p_{L/2-1}^1 p_{L/2-1}^2\}$. The first bit in each set corresponds to the earliest bit in time. There are 2 different trellis sections used in the inner code, each corresponding to a pair of input bits, and these are described in Table 24 and Table 25. In these tables all combinations of current state and input pairs are given, along with the corresponding output pair and next state.

TABLE 24

Inner Trellis Section Number 0

| Current state $S_k$ | Input bits $d_k^1 d_k^2$ | Output bits $P_k^1 P_k^2$ | Next state $S_{k+1}$ |
|---|---|---|---|
| 0 | 00 | 00 | 0 |
| 0 | 10 | 10 | 3 |
| 0 | 01 | 01 | 2 |
| 0 | 11 | 11 | 1 |
| 1 | 00 | 10 | 3 |
| 1 | 10 | 00 | 0 |
| 1 | 01 | 11 | 1 |
| 1 | 11 | 01 | 2 |
| 2 | 00 | 01 | 1 |
| 2 | 10 | 11 | 2 |
| 2 | 01 | 00 | 3 |
| 2 | 11 | 10 | 0 |
| 3 | 00 | 11 | 2 |
| 3 | 10 | 01 | 1 |
| 3 | 01 | 10 | 0 |
| 3 | 11 | 00 | 3 |

TABLE 25

Inner Trellis Section Number 1

| Current state $S_k$ | Input bits $d_k^1 d_k^2$ | Output bits $P_k^1 P_k^2$ | Next state $S_{k+1}$ |
|---|---|---|---|
| 0 | 00 | 00 | 0 |
| 0 | 10 | 11 | 3 |
| 0 | 01 | 01 | 2 |
| 0 | 11 | 10 | 1 |
| 1 | 00 | 01 | 3 |
| 1 | 10 | 10 | 0 |
| 1 | 01 | 00 | 1 |
| 1 | 11 | 11 | 2 |
| 2 | 00 | 11 | 1 |
| 2 | 10 | 00 | 2 |
| 2 | 01 | 10 | 3 |
| 2 | 11 | 01 | 0 |
| 3 | 00 | 10 | 2 |
| 3 | 10 | 01 | 1 |
| 3 | 01 | 11 | 0 |
| 3 | 11 | 00 | 3 |

These trellis sections are combined together in 4 different trellis patterns, each consisting of 16 trellis sections. The 4 default trellis patterns are shown in Table 26. According to one embodiment of the invention, encoder 600 allows these trellis patterns to be reprogrammed. The first trellis section in each trellis pattern is used as the first trellis section in the frame, followed by the second trellis section, and so on.

TABLE 26

Inner Trellis Patterns

| Trellis Pattern Number | Trellis Pattern |
|---|---|
| 0 | 1111111111111111 |
| 1 | 0000000000000000 |
| 2 | 1010101010101010 |
| 3 | 1100110011001100 |

The defaults trellis patterns for each mode are shown in Table 27, Table 28, Table 29, and Table 30. According to one embodiment of the invention, encoder 600 allows the trellis patterns for each mode to be reprogrammed. These patterns have been selected to provide superior threshold performance with a floor below a BER of $10^{-10}$.

In this example, the state of the inner encoder is initialized to the all-zero state at the beginning of each frame ($S_0=0$). Here, no termination is performed at the end of the frame.

TABLE 27

Inner Trellis Patterns for BPSK/QPSK

| Frame Size | \ | Code Rate | | | | | | |
|---|---|---|---|---|---|---|---|---|
| | 1/2 | 2/3 | 3/4 | 4/5 | 5/6 | 7/8 | 8/9 | 19/20 |
| 128 | 1 | 0 | 0 | 0 | 0 | 0 | 0 | 0 |
| 256 | 1 | 0 | 0 | 0 | 0 | 0 | 0 | 0 |
| 512 | 1 | 0 | 0 | 0 | 0 | 0 | 0 | 0 |
| 1024 | 1 | 0 | 0 | 0 | 0 | 0 | 0 | 0 |
| 2048 | 1 | 0 | 0 | 0 | 0 | 0 | 0 | 0 |
| 4096 | 1 | 0 | 0 | 0 | 0 | 0 | 0 | 0 |
| 8192 | 1 | 0 | 0 | 0 | 0 | 0 | 0 | 0 |
| 16384 | 1 | 0 | 0 | 0 | 0 | 0 | 0 | 0 |

TABLE 28

Inner Trellis Patterns for 8PSK

| Frame Size | | Code Rate | | | | | | |
|---|---|---|---|---|---|---|---|---|
| | 1/2 | 2/3 | 3/4 | 4/5 | 5/6 | 7/8 | 8/9 | 19/20 |
| 128 | 1 | 0 | 0 | 0 | 0 | 0 | 0 | 0 |
| 256 | 1 | 0 | 0 | 0 | 0 | 0 | 0 | 0 |
| 512 | 1 | 0 | 0 | 0 | 0 | 0 | 0 | 0 |
| 1024 | 1 | 0 | 0 | 0 | 0 | 0 | 0 | 0 |
| 2048 | 1 | 0 | 0 | 0 | 0 | 0 | 0 | 0 |
| 4096 | 1 | 0 | 0 | 0 | 0 | 0 | 0 | 0 |
| 8192 | 1 | 0 | 0 | 0 | 0 | 0 | 0 | 0 |
| 16384 | 1 | 0 | 0 | 0 | 0 | 0 | 0 | 0 |

TABLE 29

Inner Trellis Patterns for 16QAM

| Frame Size | | Code Rate | | | | | | |
|---|---|---|---|---|---|---|---|---|
| | 1/2 | 2/3 | 3/4 | 4/5 | 5/6 | 7/8 | 8/9 | 19/20 |
| 128 | 1 | 0 | 0 | 0 | 0 | 0 | 0 | 0 |
| 256 | 1 | 0 | 0 | 0 | 0 | 0 | 0 | 0 |
| 512 | 1 | 0 | 0 | 0 | 0 | 0 | 0 | 0 |
| 1024 | 1 | 0 | 0 | 0 | 0 | 0 | 0 | 0 |
| 2048 | 1 | 0 | 0 | 0 | 0 | 0 | 0 | 0 |
| 4096 | 1 | 0 | 0 | 0 | 0 | 0 | 0 | 0 |
| 8192 | 1 | 0 | 0 | 0 | 0 | 0 | 0 | 0 |
| 16384 | 1 | 0 | 0 | 0 | 0 | 0 | 0 | 0 |

TABLE 30

Inner Trellis Patterns for 16APSK

| Frame Size | | Code Rate | | | | | | |
|---|---|---|---|---|---|---|---|---|
| | 1/2 | 2/3 | 3/4 | 4/5 | 5/6 | 7/8 | 8/9 | 19/20 |
| 128 | 1 | 0 | 0 | 0 | 0 | 0 | 0 | 0 |
| 256 | 1 | 0 | 0 | 0 | 0 | 0 | 0 | 0 |
| 512 | 1 | 0 | 0 | 0 | 0 | 0 | 0 | 0 |
| 1024 | 1 | 0 | 0 | 0 | 0 | 0 | 0 | 0 |
| 2048 | 1 | 0 | 0 | 0 | 0 | 0 | 0 | 0 |
| 4096 | 1 | 0 | 0 | 0 | 0 | 0 | 0 | 0 |
| 8192 | 1 | 0 | 0 | 0 | 0 | 0 | 0 | 0 |
| 16384 | 1 | 0 | 0 | 0 | 0 | 0 | 0 | 0 |

Mapper 612 receives the output of inner code module 610 (parity bits), as well as the original input data (systematic bits), and maps the parity bits and systematic bits to BPSK, QPSK, 8PSK, 16QAM, or 16APSK symbols. In this example, Gray mapping is used, as shown in FIG. 7. The order in which the systematic and parity bits are mapped to the constellations depends on the code rate and the modulation.

Figure 7A:
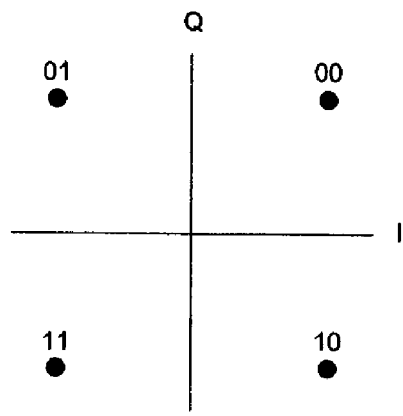
FIG. 7A presents a Gray-mapped constellation of possible symbols for a QPSK modulation scheme, according to one embodiment of the invention.
Figure 7B:
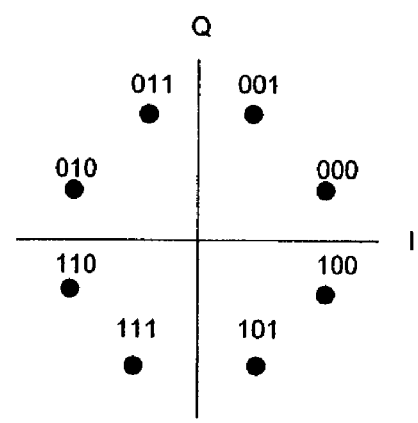
FIG. 7B presents a Gray-mapped constellation of possible symbols for a 8PSK modulation scheme, according to one embodiment of the invention.
Figure 7C:
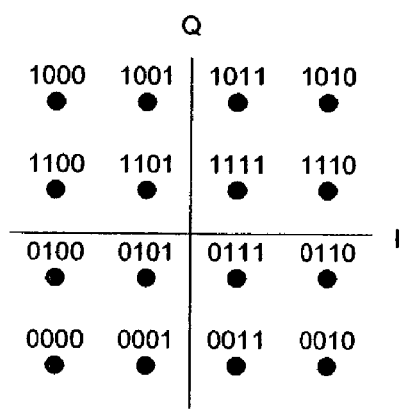
FIG. 7C presents a Gray-mapped constellation of possible symbols for a 16QAM modulation scheme, according to one embodiment of the invention.
Figure 7D:
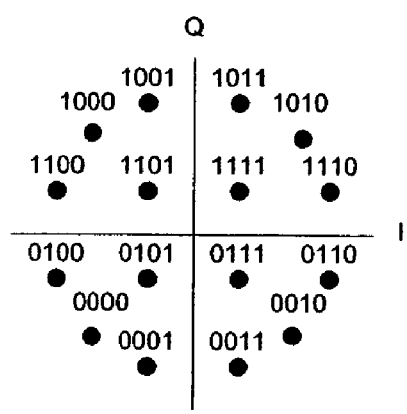
FIG. 7D presents a Gray-mapped constellation of possible symbols for a 16APSK modulation scheme, according to one embodiment of the invention.

Specifically, FIG. 7A presents a Gray-mapped constellation of possible symbols for a QPSK modulation scheme, according to one embodiment of the invention. FIG. 7B presents a Gray-mapped constellation of possible symbols for a 8PSK modulation scheme, according to one embodiment of the invention. FIG. 7C presents a Gray-mapped constellation of possible symbols for a 16QAM modulation scheme, according to one embodiment of the invention. FIG. 7D presents a Gray-mapped constellation of possible symbols for a 16APSK modulation scheme, according to one embodiment of the invention.

Here, there are K systematic bits and L parity bits. These are considered as pairs of bits: the systematic bits are labeled $\{s_0^1 s_0^2 s_1^1 s_1^2 \ldots s_k^1 s_k^2 \ldots s_{K/2-1}^1 s^{K/2-12}\} = \{b_1^1 b_1^2 \ldots b_k^1 b_k^2 \ldots b_{K/2-1}^1 b_{K/2-1}^2 b_0^1 b_0^2\}$ (note the reordering of the first pair of input bits due to the tail biting termination of the outer code), and the parity bits are labeled $\{p_0^1 p_0^2 p_1^1 p_1^2 \ldots p_l^1 p_l^2 p_{L/2-1}^1 p_{L/2-1}^2\}$. The first bit in each set corresponds to the earliest bit in time. When there are an odd number of parity bits a zero bit is inserted in the last pair in the least significant bit (LSB) position $\{p_1^2\}$. The number of parity bits is therefore:

$$L = \left\lceil \frac{2K}{J} \right\rceil_2$$

where $\lceil x \rceil_2$ denotes the next highest multiple of 2 above x.

According to one embodiment of the invention, in QPSK mode, symbols are formed from either a pair of systematic bits or a pair of parity bits. When the kth systematic symbol is transmitted $s_k^1$ is mapped to the LSB of the symbol label shown in FIG. 7A, and $s_k^2$ is mapped to the most significant bit (MSB). When the lth parity symbol is transmitted $p_l^1$ is mapped to the LSB of the symbol label shown in FIG. 7A, and $p_l^2$ is mapped to the MSB. The systematic and parity symbols are interlaced on the channel, depending on the code rate. The mapping pattern is shown in Table 31, where s is a systematic symbol, and p is a parity symbol. The first symbol of a frame uses the first indicator in the mapping pattern; the second symbol in the frame uses the second indicator in the mapping pattern, and so on. When the mapping pattern is exhausted it is cycled back to the beginning. When the end of the frame is reached part way through the mapping pattern it is simply truncated, and the first symbol of the next frame uses the first indicator in the mapping pattern again. Here, an even number of symbols is always transmitted. If the end of the frame is reached when a symbol pair is partially complete it is filled with zero bits. The total number of symbols S in QPSK mode is therefore:

$$S_4 = \left\lceil \frac{K+L}{2} \right\rceil_2$$

TABLE 31

QPSK Mapping Patterns

| Rate | Mapping pattern |
|---|---|
| 1/2 | ps |
| 2/3 | pss |
| 3/4 | psss |
| 4/5 | pssss |
| 5/6 | psssss |
| 7/8 | psssssss |
| 8/9 | pssssssss |
| 19/20 | psssssssssssssssssss |

According to one embodiment of the invention, in BPSK mode, the mapping is the same as in QPSK mode, except that I and Q are interlaced. The QPSK I channel corresponds to the first BPSK symbol.

In 8PSK mode two symbols are formed at a time from either three pairs of systematic bits, three pairs of parity bits, or a mixture of two pairs of systematic bits and one pair of parity bits. An all-systematic symbol-pair is formed from the pairs $\{s_k^1 s_k^2\}$, $\{s_{k+1}^1 s^{k+1\,2}\}$ and $\{s_{k+2}^1 s_{k+2}^2\}$. The symbol label of the first 8PSK symbol is $\{s_k^2 s_k^1 s_{k+2}^1\}$ where $s_k^2$ is the MSB of the symbol label shown in FIG. 7B, and $s_{k+2}^1$ is the LSB. The symbol label of the second 8PSK symbol is $\{s_{k+1}^2 s_{k+1}^1 s_{k+2}^2\}$ where $s_{k+1}^2$ is the MSB of the symbol label shown in FIG. 7B, and $s_{k+2}^2$ is the LSB. An all-parity symbol-pair is formed from the pairs $\{p_1^1 p_I^2\}$, $\{p_{I+1}^1 p_{I+1}^2\}$ and $\{p_{I+2}^1 p_{I+2}^2\}$. The symbol label of the first 8PSK symbol is $\{p_I^2 p_I^1 p_{I+2}^1\}$ where $p_I^2$ is the MSB of the symbol label shown in FIG. 7B, and $p_{I+2}^1$ is the LSB. The symbol label of the second 8PSK symbol is $\{p_{I+1}^2 p_{I+1}^1 p_{I+2}^2\}$ where $p_{I+1}^2$ is the MSB of the symbol label shown in FIG. 7B, and $p_{I+2}^2$ is the LSB. A mixed systematic and parity symbol-pair is formed from the pairs $\{s_k^1 s_k^2\}$, $\{s_{k+1}^1 s_{k+1}^2\}$ and $\{p_I^1 p_I^2\}$. The symbol label of the first 8PSK symbol is $\{s_k^2 s_k^1 p_I^1\}$ where $s_k^2$ is the MSB of the symbol label shown in FIG. 7B, and $p_I^1$ is the LSB. The symbol label of the second 8PSK symbol is $\{s_{k+1}^2 s_{k+1}^1 p_I^2\}$ where $s_{k+1}^2$ is the MSB of the symbol label shown in FIG. 7B, and $p_I^2$ is the LSB.

In this example, the systematic, parity, and mixed symbols are interlaced on the channel, depending on the code rate. The mapping pattern is shown in Table 32, where s is an all-systematic symbol-pair, p is an all-parity symbol-pair, and m is a mixed systematic and parity symbol-pair. The first symbol-pair of a frame uses the first indicator in the mapping pattern; the second symbol-pair in the frame uses the second indicator in the mapping pattern, and so on. When the mapping pattern is exhausted it is cycled back to the beginning. When the end of the frame is reached part way through the mapping pattern it is simply truncated, and the first symbol-pair of the next frame uses the first indicator in the mapping pattern again. An even number of symbols is always transmitted. If the end of the frame is reached when a symbol-pair is partially complete it is filled with zero bits. The total number of symbols S in 8PSK mode is therefore $$S_8 = \left\lceil \frac{K+L}{3} \right\rceil_2$$

TABLE 32

8PSK Mapping Patterns

| Rate | Mapping pattern |
|---|---|
| 1/2 | pmmm |
| 2/3 | m |
| 3/4 | mmms |
| 4/5 | msmms |
| 5/6 | ms |
| 7/8 | mssmssms |
| 8/9 | mss |
| 19/20 | mssssmsssssmssssss |

According to one embodiment of invention, in 16QAM and 16APSK modes, one symbol is formed at a time from either two pairs of systematic bits, two pairs of parity bits, or a mixture of one pair of systematic bits and one pair of parity bits. An all-systematic symbol is formed from the pairs $\{s_k^1 s_k^2\}$ and $\{s_{k+1}^1 s_{k+1}^2\}$. The symbol label of the 16QAM/16APSK symbol is $\{s_k^2 s_{k+1}^2 s_k^1 s_{k+1}^1\}$ where $S_k^2$ is the MSB of the symbol label shown in FIGS. 7C and 7D, and $s_{k+1}^1$ is the LSB. An all-parity symbol is formed from the pairs $\{p_I^{p1} p_I^2\}$ and $\{p_{I+1}^1 p_{I+1}^2\}$. The symbol label of the 16QAM/16QAPSK symbol is $\{p_I^2 p_{I+1}^2 p_I^1 p_{I+1}^1\}$ where $p_I^2$ is the MSB of the symbol label shown in FIGS. 7C and 7D, and $p_{I+1}^1$ is the LSB. A mixed systematic and parity symbol is formed from the pairs $\{s_k^1 s_k^2\}$ and $\{p_I^1 p_I^2\}$. The symbol label of the 16QAM/16APSK symbol is $\{s_k^2 p_I^2 s_k^1 p_I^1\}$ where $S_k^2$ is the MSB of the symbol label shown in FIGS. 7A through 7D, and $p_I^1$ is the LSB.

Again in this example, the systematic, parity and mixed symbols are interlaced on the channel, depending on the code rate. The mapping pattern is shown in Table 33, where s is an all-systematic symbol, p is an all-parity symbol, and m is a mixed systematic and parity symbol. The first symbol of a frame uses the first indicator in the mapping pattern; the second symbol in the frame uses the second indicator in the mapping pattern, and so on. When the mapping pattern is exhausted it is cycled back to the beginning. When the end of the frame is reached part way through the mapping pattern it is simply truncated, and the first symbol of the next frame uses the first indicator in the mapping pattern again. An even number of symbols is always transmitted. If the end of the frame is reached when a symbol pair is partially complete it is filled with zero bits. The total number of symbols S in 16QAM and 16APSK modes is therefore:

$$S_{16} = \left\lceil \frac{K+L}{4} \right\rceil_2$$

TABLE 33

16QAM/16APSK Mapping Patterns

| Rate | Mapping pattern |
|---|---|
| 1/2 | m |
| 2/3 | mms |
| 3/4 | ms |

TABLE 33-continued

16QAM/16APSK Mapping Patterns

| Rate | Mapping pattern |
|---|---|
| 4/5 | msmss |
| 5/6 | mss |
| 7/8 | msss |
| 8/9 | msssmssss |
| 19/20 | mssssssss |

In the present example, the number of output symbols of encoder 600 is shown in Table 34 for BPSK/QPSK mode, in Table 35 for 8PSK, and in Table 36 for 16QAM/16APSK.

TABLE 34

Number of encoder output symbols for BPSK/QPSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 128 | 96 | 86 | 80 | 78 | 74 | 72 | 68 |
| 256 | 256 | 192 | 172 | 160 | 154 | 148 | 144 | 136 |
| 512 | 512 | 384 | 342 | 320 | 308 | 294 | 288 | 270 |
| 1024 | 1024 | 768 | 684 | 640 | 616 | 586 | 576 | 540 |
| 2048 | 2048 | 1536 | 1366 | 1280 | 1230 | 1172 | 1152 | 1078 |
| 4096 | 4096 | 3072 | 2732 | 2560 | 2458 | 2342 | 2304 | 2156 |
| 8192 | 8192 | 6144 | 5462 | 5120 | 4916 | 4682 | 4608 | 4312 |
| 16384 | 16384 | 12288 | 10924 | 10240 | 9832 | 9364 | 9216 | 8624 |

TABLE 35

Number of encoder output symbols for 8PSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 86 | 64 | 58 | 54 | 52 | 50 | 48 | 46 |
| 256 | 172 | 128 | 114 | 108 | 104 | 98 | 96 | 90 |
| 512 | 342 | 256 | 228 | 214 | 206 | 196 | 192 | 180 |
| 1024 | 684 | 512 | 456 | 428 | 410 | 392 | 384 | 360 |
| 2048 | 1366 | 1024 | 912 | 854 | 820 | 782 | 768 | 720 |
| 4096 | 2732 | 2048 | 1822 | 1708 | 1640 | 1562 | 1536 | 1438 |
| 8192 | 5462 | 4096 | 3642 | 3414 | 3278 | 3122 | 3072 | 2876 |
| 16384 | 10924 | 8192 | 7282 | 6828 | 6554 | 6242 | 6144 | 5750 |

TABLE 36

Number of encoder output symbols for 16QAM/16APSK

| Frame Size | Code Rate | | | | | | | |
|---|---|---|---|---|---|---|---|---|
| | 1/2 | 2/3 | 3/4 | 4/5 | 5/6 | 7/8 | 8/9 | 19/20 |
| 128 | 64 | 48 | 44 | 40 | 40 | 38 | 36 | 34 |
| 256 | 128 | 96 | 86 | 80 | 78 | 74 | 72 | 68 |
| 512 | 256 | 192 | 172 | 160 | 154 | 148 | 144 | 136 |
| 1024 | 512 | 384 | 342 | 320 | 308 | 294 | 288 | 270 |
| 2048 | 1024 | 768 | 684 | 640 | 616 | 586 | 576 | 540 |
| 4096 | 2048 | 1536 | 1366 | 1280 | 1230 | 1172 | 1152 | 1078 |
| 8192 | 4096 | 3072 | 2732 | 2560 | 2458 | 2342 | 2304 | 2156 |
| 16384 | 8192 | 6144 | 5462 | 5120 | 4916 | 4682 | 4608 | 4312 |

Encoder With Puncture Module

As mentioned previously, the overall coding rate of encoder 600 can be changed by changing the value of J in the single parity check (SPC) module 608. The overall coding rate of encoder 600 may be expressed as $r=J/(J+2)$. This method of controlling the overall coding rate only allows for very coarse control of the overall coding rate, especially for small values of J. For example, there will only be one overall coding rate between $r=1/2$ (J=2) and $r=2/3$ (J=4): $r=3/5$ (J=3). However, it is possible to achieve finer coding rate control with these encoders by puncturing the parity data stream 614.

Figure 15:
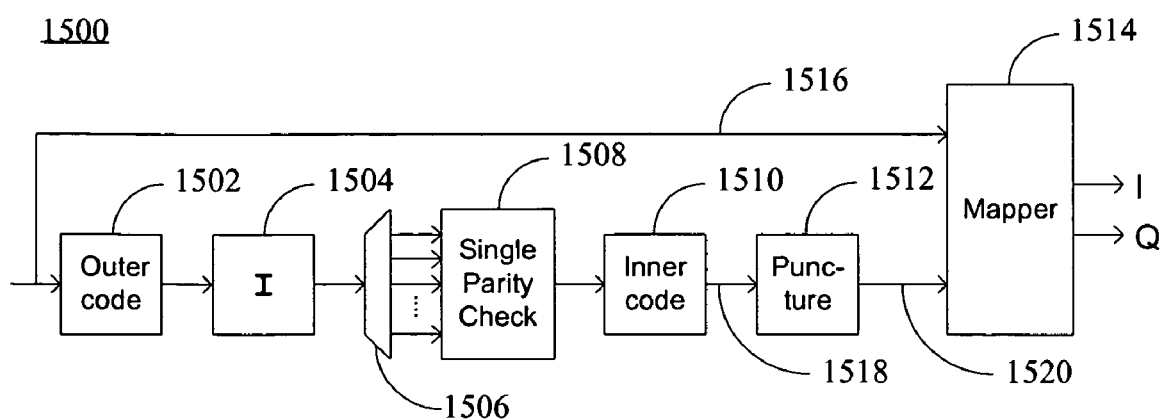
FIG. 15 is an illustrative block diagram of an encoder that contains a puncture module, for an improved error correction coding scheme according to one embodiment of the present invention.

FIG. 15 is an illustrative block diagram of an encoder 1500 for improved coding rate control according to one embodiment of the present invention. Encoder 1500 may include components similar to those found in encoder 600. Specifically, encoder 1500 comprises an outer code module 1502, an interleaver 1504, a serial to parallel converter 1506, a single parity check (SPC) module 1508, in inner code module 1510, a puncture module 1512, and a mapper 1514. As shown in the figure encoder 1500 generates a systematic code. In other words, both the encoded bits generated from the input bits, as well as the input bits themselves, are sent through the channel. The channel as described here broadly refers to a medium of data transmission or data storage that potentially introduces errors in the data.

Puncture module 1512 punctures the bits output by inner code module 1510. This involves deleting some bits from the parity data stream 1518 output by inner code module 1510, and only outputting the undeleted bits to mapper 1514 as the punctured parity data stream 1520. If the total number of bits in parity data stream 1510 is $K_p$ and the total number of bits in punctured data stream 1520 is $N_p$ then the ratio of punctured bits to original bits may be expressed as $p=N_p/K_p$. It is this puncturing that allows fine coding rate control. The overall coding rate of encoder 1500 may be expressed as $r_p=r/(r+p(1-r))$, where $r=J/(J+2)$ is the rate of the unpunctured code set by the value of J in SPC module 1508.

In one embodiment of the invention, 5 different values of J are used in SPC module 1508 to provide coarse rate control of $r=1/2$ (J=2), $r=2/3$ (J=4), $r=4/5$ (J=8), $r=8/9$ (J=16), and $r=16/17$ (J=32). A periodic puncture pattern in puncture module 1504 of period 16 produces 9 different puncture ratios of $p=16/16$, $p=15/16$, $p=14/16$, $p=13/16$, $p=12/16$, $p=11/16$, $p=10/16$, $p=9/16$, and $p=8/16$ to fine rate control. This results in 45 overall coding rates from $r_p=1/2$ to $r_p=32/33$ (with 8 rates from $r_p=1/2$ to $r_p=2/3$, compare to just one without using puncturing).

Mapper 1514 is the same as mapper 612 and receives the output of puncture module 1512 and the original input data. Here, mapper 1514 represents a flexible mapper circuit that can take the punctured data stream 1520 and systematic data stream 1516 and map them into a format suitable for sending through the channel.

Special Case of Encoder With Puncture Module

In most cases the addition of the puncture module 1512 to create encoder 1500 from encoder 600 will mean that encoder 1500 will generate a different codeword compared to encoder 600 (i.e. if the systematic data streams 616 and 1516 are the same then the parity data streams 614 and 1520 will differ). However, there is at least one special case where encoder 600 and encoder 1500 may generate the same outputs given the same inputs. Such a special case is when inner code module 610 and inner code module 1510 are "accumulators". An accumulator is a rate 1/1 2-state convolutional code with a time-invariant trellis.

FIG. 16 is an illustrative block diagram of an accumulator 1600. Here, accumulator 1600 comprises a modulo-2 adder (exclusive-or gate) 1602 and delay element 1604.

Figure 17A:
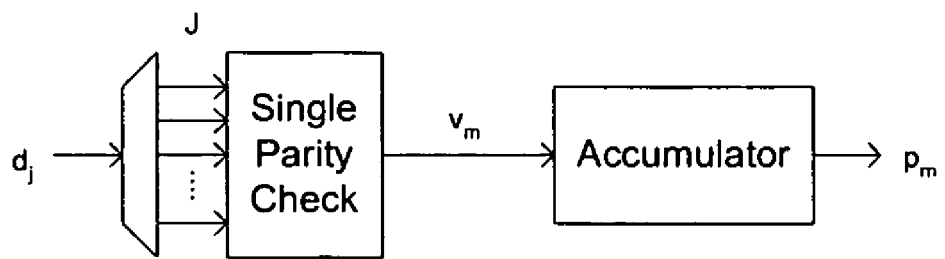
FIG. 17A is an illustrative block diagram of a single parity check module followed by an accumulator, which is functionally identical to FIG. 17B according to one embodiment of the present invention.

Consider the case of a serial to parallel converter and single parity check (SPC) followed by an accumulator, as illustrated in FIG. 17A. The i-th input to the serial to parallel converter is $d_i$. Therefore the m-th output of the SPC is $v_m = d_{mJ} + d_{mJ+1} + \ldots + d_{mJ+J-1}$. Due to the recursive nature of the accumulator, the m-th output of the accumulator is therefore $p_m = p_{m-1} + v_m = p_{m-1} + d_{mJ} + d_{mJ+1} + \ldots + d_{mJ+J-1}$.

Figure 17B:
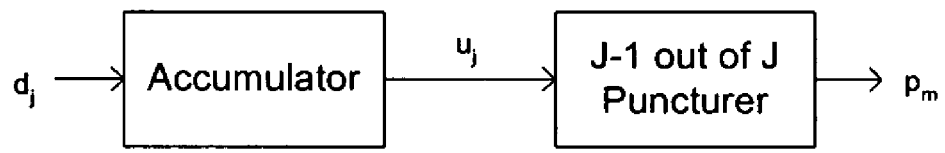
FIG. 17B is an illustrative block diagram of an accumulator followed by puncture module, which is functionally identical to FIG. 17A according to one embodiment of the present invention.

Now consider the case of an accumulator followed by a puncture module that punctures J−1 out of every J bits, as illustrated in FIG. 17B. The i-th input $d_i$ is identical to the previous case. This means that the i-th output of the accumulator $u_i = u_{i-1} + d_i$ and after J inputs $u_i = u_{i-J} + d_{i-J} + d_{i-J+1} + \ldots + d_{i-1}$. So if we puncture J−1 out of every J of $u_i$, then $p_m = u_{\lfloor i/J \rfloor}$. Another way of saying this is that for every J bits input to puncture module J−1 bits are punctured and only 1 bit is output.

This means that an accumulator followed by a J−1 out of J bit puncture module generates the same sequence of outputs as a J bit SPC followed by an accumulator if the inputs to both circuits is the same.

Also, an SPC followed by an accumulator followed by a puncture module can be constructed that is equivalent to a pure SPC followed by accumulator, or a pure accumulator followed by a puncture module. For example with the same inputs an SPC with J=2 followed by an accumulator followed by a puncture module that punctures every $2^{nd}$ input will generate the same outputs as both an SPC with J=4 followed by an accumulator, and an accumulator followed by a puncture module that punctures every $4^{th}$ input.

Specific Example of Encoder With Puncture Module

Below is a detailed description of a specific example of an encoder that flexibly performs encoding for different data frame sizes, coding rates, and modulations, in accordance with one embodiment of the invention. The structure presented previously as encoder 1500 is utilized again for illustrative purposes. Here, the encoder may operate with eight default frame sizes ranging from 128 bits to 16384 bits, as listed below. Each data frame refers to a collection of data organized as a group for processing.

128 bits;
256 bits;
512 bits;
1024 bits;
2048 bits;
4096 bits;
8192 bits; and
16384 bits.

These data frame sizes are presented for illustrative purpose. Other sizes may also be adopted. In accordance with one embodiment of the invention, the encoder may be reprogrammed to support different sets of frame sizes. For example, the encoder may be reprogrammed to support another set of eight different frame sizes. Also, the encoder may allow the frame size to be selected from the available sizes on a frame-by-frame basis.

Here, the encoder supports 45 different code rates. These 45 code rates are derived from a combination of coarse rate control and fine rate control. The coarse rate control is controlled by varying r, where r=J/(J+2) is the rate of the unpunctured code set by the value of J in SPC module 1508. There are 5 possible values of r:

r=1/2 (J=2);
r=2/3 (J=4);
r=4/5 (J=8);
r=8/9 (J=16); and
r=16/17 (J=32).

These rates are presented for illustrative purposes. Other code rates may also be used in accordance with the present invention. The fine rate control is controlled by varying p, where p is the puncture ratio used in the puncture module 1512. There are 9 possible values of p:

p=16/16;
p=15/16;
p=14/16;
p=13/16;
p=12/16;
p=1/16;
p=10/16;
p=9/16; and
p=8/16.

These ratios are presented for illustrative purposes. Other puncture ratios may also be used in accordance with the present invention. The overall coding rate of encoder 1500 may be expressed as $r_p = r/(r+p(1-r))$.

The encoder may optionally output a coded bit stream directly, or map the bit stream onto user specified modulation symbols. The possible mappings in this example are:

BPSK;
QPSK;
16QAM;
64QAM; and
256QAM.

These mappings are presented for illustrative purposes. Other mappings may also be adopted in accordance with the invention. In one embodiment, other mappings may be supported by using BPSK or QPSK mode and performing the mapping externally.

Referring back to FIG. 15, encoder 1500 may utilize an outer code module 1502 that implements a rate 2/4 2-state convolutional code with a time-invariant trellis. There are K input bits to the outer encoder, and 2K output bits. The input bits are considered as pairs of bits and are labeled $\{b_0^1 b_0^2 b_1^1 b_1^2 \ldots b_k^1 b_k^1 \ldots b_{K/2-1}^1 b_{K/2-1}^2\}$. The output bits are considered as quadruples of 4 bits and are labeled $\{c_0^1 c_0^2 c_0^3 c_0^4 c_1^1 c_1^2 c_1^3 c_1^4 \ldots c_k^1 c_k^2 c_k^3 c_k^4 \ldots c_{K/2-1}^1 c_{K/2-1}^2 c_{K/2-1}^3 c_{K/2-1}^4\}$. The first bit in each set corresponds to the earliest bit in time.

Outer code module 1502 utilizes a time-invariant trellis. Table 37 gives the trellis section for all combinations of current state and input pairs are given, along with the corresponding output quadruple and next state.

TABLE 37

Outer Code 2-State Trellis Section

| Current state $S_k$ | Input bits $b_{k+1}^1 b_{k+1}^2$ | Output bits $c_k^1 c_k^2 c_k^3 c_k^4$ | Next state $S_{k+1}$ |
|---|---|---|---|
| 0 | 00 | 0000 | 0 |
| 0 | 10 | 1111 | 0 |
| 0 | 01 | 0011 | 1 |
| 0 | 11 | 1100 | 1 |
| 1 | 00 | 1100 | 0 |
| 1 | 10 | 0011 | 0 |
| 1 | 01 | 1111 | 1 |
| 1 | 11 | 0000 | 1 |

According to one embodiment, tail biting termination is used in the outer encoder. Specifically, the first two bits of the frame are used to initialize the encoder state: $S_0 = 2b_0^2 + b_0^1$. Nothing is output during this time and these first two bits are stored. Then, once the end of the frame is reached, the first two bits are again input into the encoder and outputs generated. This returns the encoder to the same state as the initial state.

Referring again to FIG. 15, interleaver 1504 performs interleaving on the output of outer code module 1502. In this example, the interleaver block length is twice the data frame size. According to one embodiment of the invention, the interleaver block length is programmable, and the interleaver uses a Dithered Relative Prime (DRP) algorithm, which is well known. Here, the inputs to the interleaver are divided into groups of 64 bits, and the bits in each group are permuted within the group using the same permutation for each group (referred to as the input dither). If $v_{in}$ is a vector that represents the bits input to the interleaver ($v_{in}(i)$ is the ith bit into the interleaver) then the output of the input dither circuit is:

$$v_a(i) = v_{in}(I_a(i)),$$

where $$I_a(i) = 64 \lfloor i/64 \rfloor + r(i \bmod 64).$$

r(i) is the input dither pattern and is defined in Table 38. Here, the input dither pattern is the same for all modes. Bits at the output of the input dither circuit are interleaved in a relative prime fashion. The output of the relative prime interleaver circuit is:

$$v_b(i) = v_a(I_b(i))$$

where $$I_b(i) = (s + ip) \bmod (2K)$$

and K is the number of information bits in the frame. The default relative prime interleaver parameters are varied according to the frame size, and are given in Table 39. According to one embodiment of the invention, encoder 1500 allows the prime interleaver parameters to be reprogrammed. The output bits of the relative prime interleaver are again grouped into groups of 64 bits and permuted according to the output dither. The output of the output dither circuit, which may be the final output of the interleaver circuit, is:

$$v_{out}(i) = v_b(I_c(i))$$

where $$I_c(i) = 64 \lfloor i/64 \rfloor + w(i \bmod 64)$$

w(i) is the output dither pattern and is varied according to the frame size. The output dither pattern is defined in Table 38.

TABLE 38

Input and Output Dither Patterns

| K | Dither | Pattern |
|---|---|---|
| All | r | (42, 34, 55, 47, 15, 7, 10, 50, 21, 63, 22, 26, 3, 40, 14, 38, 4, 39, 60, 32, 11, 57, 56, 18, 44, 54, 23, 58, 1, 12, 62, 31, 29, 48, 28, 13, 41, 52, 53, 33, 43, 20, 17, 36, 27, 35, 30, 5, 6, 46, 37, 45, 9, 24, 59, 8, 25, 19, 49, 61, 16, 2, 0, 51) |
| 128 | w | (38, 60, 59, 0, 40, 25, 29, 26, 9, 24, 1, 42, 37, 13, 62, 49, 3, 30, 23, 45, 36, 32, 18, 8, 50, 51, 5, 47, 31, 53, 21, 4, 58, 17, 6, 43, 14, 19, 12, 41, 7, 34, 63, 11, 55, 44, 35, 27, 54, 28, 20, 46, 61, 57, 2, 39, 56, 33, 22, 16, 52, 15, 48, 10) |
| 256 | w | (54, 40, 29, 20, 12, 39, 19, 50, 55, 28, 31, 34, 43, 35, 62, 47, 53, 30, 17, 3, 32, 52, 26, 44, 58, 5, 11, 25, 41, 27, 59, 0, 18, 15, 22, 45, 46, 37, 24, 23, 33, 10, 9, 13, 49, 56, 21, 61, 38, 8, 48, 14, 51, 7, 42, 1, 60, 63, 6, 4, 16, 57, 36, 2) |
| 512 | w | (4, 54, 11, 34, 26, 21, 1, 0, 37, 42, 13, 48, 25, 17, 12, 29, 35, 44, 63, 49, 46, 2, 40, 58, 8, 51, 57, 7, 23, 9, 41, 14, 32, 61, 36, 27, 60, 19, 38, 5, 15, 24, 55, 59, 31, 6, 3, 43, 52, 22, 62, 28, 33, 53, 56, 47, 10, 45, 20, 18, 30, 39, 50, 16) |
| 1024 | w | (61, 23, 16, 51, 11, 34, 62, 41, 50, 27, 58, 25, 54, 14, 37, 10, 8, 5, 20, 46, 47, 19, 49, 43, 17, 24, 22, 60, 12, 38, 6, 15, 9, 42, 29, 32, 21, 56, 7, 18, 36, 33, 44, 0, 52, 39, 40, 48, 45, 55, 63, 53, 30, 2, 1, 4, 59, 26, 13, 35, 31, 28, 3, 57,) |
| 2048 | w | (56, 30, 5, 2, 42, 51, 23, 12, 35, 26, 27, 28, 31, 7, 16, 11, 13, 48, 1, 39, 6, 34, 4, 10, 36, 61, 63, 25, 9, 47, 15, 38, 44, 43, 24, 53, 32, 29, 46, 3, 49, 20, 41, 21, 33, 14, 45, 37, 8, 62, 54, 0, 55, 19, 52, 17, 58, 59, 40, 18, 22, 57, 50, 60,) |
| 4096 | w | (5, 23, 60, 3, 59, 38, 18, 1, 54, 11, 30, 49, 42, 34, 13, 46, 20, 45, 48, 2, 15, 35, 41, 27, 9, 36, 10, 56, 8, 26, 58, 47, 33, 14, 37, 12, 61, 4, 7, 22, 0, 25, 40, 44, 16, 39, 52, 28, 53, 55, 31, 29, 50, 6, 57, 32, 43, 62, 21, 51, 63, 24, 19, 17,) |
| 8192 | w | (37, 55, 60, 35, 27, 38, 18, 33, 54, 43, 30, 17, 42, 34, 45, 46, 20, 13, 48, 2, 47, 3, 9, 59, 41, 36, 10, 56, 8, 26, 58, 15, 1, 14, 5, 12, 29, 4, 39, 22, 0, 57, 40, 44, 16, 7, 52, 28, 21, 23, 63, 61, 50, 6, 25, 32, 11, 62, 53, 19, 31, 24, 51, 49,) |
| 16384 | w | (41, 35, 44, 63, 23, 30, 58, 21, 46, 39, 54, 5, 50, 10, 17, 6, 36, 49, 48, 42, 59, 31, 29, 55, 61, 52, 18, 24, 40, 34, 2, 27, 53, 38, 9, 60, 1, 20, 19, 14, 0, 13, 8, 28, 16, 51, 4, 12, 25, 3, 11, 33, 26, 62, 45, 32, 7, 22, 57, 47, 43, 56, 15, 37,) |

TABLE 39

Relative Prime Interleaver Parameters

| K | p | s |
|---|---|---|
| 128 | 113 | 41 |
| 256 | 51 | 45 |
| 512 | 275 | 35 |
| 1024 | 967 | 4 |
| 2048 | 2201 | 55 |
| 4096 | 2531 | 0 |
| 8192 | 9539 | 0 |
| 16384 | 9239 | 0 |

Serial to parallel converter 1506 transforms the output of interleaver 1504 from serial form to parallel form. Specifically, the bits from interleaver 1504 are grouped into groups of J bits and input to single parity check (SPC) module 1508.

SPC module 1508 performs a single parity check operation on each group of J input bits. According to one embodiment of the invention, SPC module 1508 is implemented as a circuit that exclusive-ORs the J bits together to generate a single output bit for every group of J inputs bits. Here, the value of J is programmable and controls the coarse rate of the code associated with encoder 1500. As mentioned previously, this overall rate of the code is approximately J/(J+2). The J values used in each rate are shown in Table 40. In one embodiment, if the number of bits from the interleaver are not divisible by J, the remaining bits (<J) are simply exclusive-ORed together to form the final output bit of the SPC module 1508.

TABLE 40

Values of J for each coarse rate

| Coarse Rate | J |
|---|---|
| 1/2 | 2 |
| 2/3 | 4 |
| 4/5 | 8 |
| 8/9 | 16 |
| 16/17 | 32 |

Inner code module 1510 encodes the data received from SPC module 1508. Here, the inner encoder is a rate 1/1, 2-state convolutional code with a time-invariant trellis. There are L input bits to the inner encoder, and L output bits. The input bits are considered as pairs of bits and are labeled $\{d_0^1 d_0^2 d_1^1 d_1^2 \ldots d_k^1 d_k^2 \ldots d_{L/2-1}^1 d_{L/2-1}^2\}$. The output bits are considered as pairs of bits and are labeled $\{p_0^1 p_0^2 p_1^1 p_1^2 \ldots p_l^1 p_l^2 \ldots p_{L/2-1}^1 p_{L/2-1}^2\}$. The first bit in each set corresponds to the earliest bit in time. The trellis sections used in the inner code, each corresponding to a pair of input bits, are described in Table 41. In this table all combinations of current state and input pairs are given, along with the corresponding output pair and next state.

TABLE 41

Inner 2-State Trellis Section

| Current state $S_k$ | Input bits $d_k^1 d_k^2$ | Output bits $p_k^1 p_k^2$ | Next state $S_{k+1}$ |
|---|---|---|---|
| 0 | 00 | 00 | 0 |
| 0 | 10 | 11 | 1 |
| 0 | 01 | 01 | 0 |
| 0 | 11 | 10 | 1 |
| 1 | 00 | 11 | 1 |
| 1 | 10 | 00 | 0 |
| 1 | 01 | 10 | 0 |
| 1 | 11 | 01 | 1 |

In this example, the state of the inner encoder is initialized to the all-zero state at the beginning of each frame ($S_0=0$). Here, no termination is performed at the end of the frame.

Puncture module 1512 punctures the data received from inner code module 1510. A fixed puncture period of 32 is used in all modes. Table 42 gives the puncture pattern that corresponds to each puncture ratio. In each pattern a 1 indicates that a bit is kept, and a 0 indicates that a bit is punctured.

TABLE 42

Puncture patterns for each puncture ratio

| Ratio | Pattern |
|---|---|
| 16/16 | 11111111111111111111111111111111 |
| 15/16 | 11111111111111111111111111011101 |
| 14/16 | 11111111111111111011101110111101 |
| 13/16 | 11111111110111011101110111011101 |
| 12/16 | 11011101110111011101110111011101 |
| 11/16 | 11011101110111011101110101010101 |
| 10/16 | 11011101110110101010101010101010 |
| 9/16 | 11011101010101010101010101010101 |
| 8/16 | 01010101010101010101010101010101 |

The systematic data bits 1516 and punctured parity bits 1520 are concatenated together and interleaved prior to being mapped by the mapper module 1514. If $v_p$ is a vector containing the systematic data bits and punctured parity bits (the systematic data bits are placed in order in $v_p$, followed by the punctured parity bits in order).

Bits in $v_p$ are interleaved in a relative prime fashion. The output of the relative prime interleaver circuit is $v_o$:

$$v_o(i) = v_p(I_p(i))$$

where $$I_p(i) = (1367i) \mod(M)$$

and M is the number of information bits in $v_p$.

The bits in $v_o$ are input to the mapper module 1514 where they are mapped onto one of the following signal sets using a Gray mapping:

BPSK;
QPSK;
16QAM;
64QAM; or
256QAM.

Decoder

Figure 8:
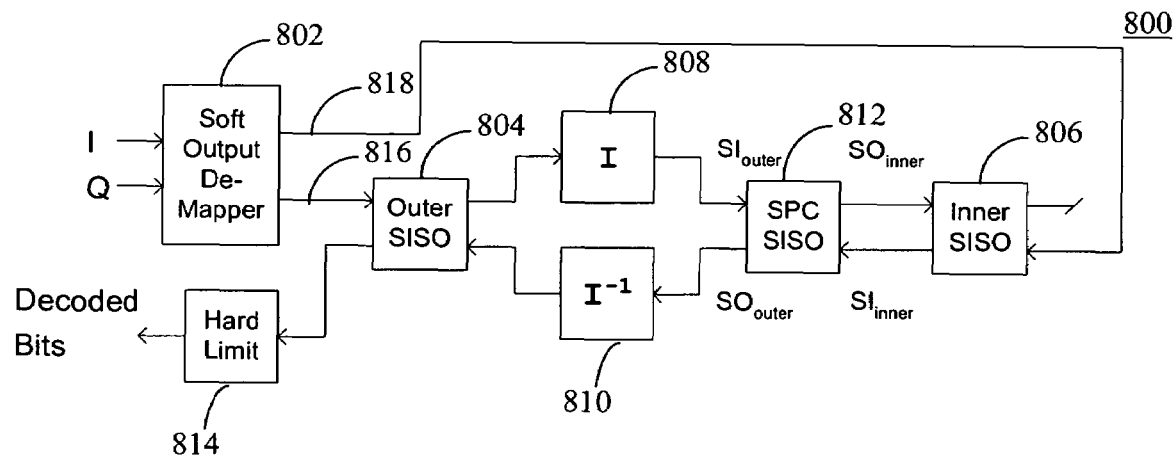
FIG. 8 is an illustrative block diagram of a decoder for an improved error correction coding scheme according to one embodiment of the present invention.

FIG. 8 is an illustrative block diagram of a decoder 800 for an improved error correction coding scheme according to one embodiment of the present invention. Here, decoder 800 comprises a soft output demapper 802, an outer soft-input-soft-output (SISO) module 804, an inner SISO module 806, an interleaver 808, a de-interleaver 810, a single parity check (SPC) SISO module 812, and a hard limiter 814.

As shown in the figure, soft output demapper 802 received I and Q samples obtained from the channel. In accordance with the appropriate modulation scheme, soft output demapper 802 demaps the I and Q samples into soft channel metrics.

The channel metrics for the systematic bits (systematic channel metrics 816) are passed to outer SISO module 804, and the channel metrics for the parity bits (parity channel metrics 818) are passed to the inner SISO module 806. Here, the systematic nature of the code requires decoding to commence with the outer code.

The outer code may be decoded in the same way in which the outer code in an SCCC is decoded, using a SISO decoding algorithm such as the well-known forward-backward algorithm. The forward-backward algorithm is described, for example, in L. R. Bahl et al., "Optimal Decoding of Linear Codes for Minimizing Symbol Error Rate," *IEEE Trans. Info. Theory*, vol. IT-20, March 1974, pp. 248-87.

Next, the SPC code is decoded in the outer-inner direction. Interleaver 808 interleaves the soft outputs of outer SISO module 804. Here, interleaver 808 has a block length of 2K, corresponding to the block length of interleaver 604 of encoder 600 shown in FIG. 6. SPC SISO module 812 receives from interleaver 808 the interleaved version of the outer code soft outputs. Here, one soft output is generated for every J soft inputs. This corresponds to the J input bits to SPC encoder 608 of encoder 600 shown in FIG. 6. SPC SISO module 812 may use the well-known message-passing algorithm to process soft inputs and soft outputs. The message-passing algorithm is described, for example, in R. Gallager, "Low Density Parity-Check Codes," *IRE Trans. Info. Theory*, vol. 7, January 1962, pp. 21-28.

There are 2K soft-inputs (denoted $SI_{outer}$) to SPC SISO module 812 from the outer SISO module 804, and 2K/J soft-outputs (denoted $SO_{inner}$) to inner SISO module 806. The soft-outputs are calculated using the following expression:

$$SO_{inner}^k = g(SI_{outer}^{Jk}, SI_{outer}^{Jk+1}, \ldots, SI_{outer}^{Jk+J-1}), \text{ for } 0 \leq k < 2K/J$$

where g is the recursive function:

$$g(a,b) = sgn(a) \times sgn(b) \times \min(|a|,|b|) + f(a,b)$$

and f is:

$$f(a,b) = \log\left(\frac{1+e^{-|a+b|}}{1+e^{-|a-b|}}\right)$$

which can be implemented in a look up table, according to one embodiment of the invention.

The SPC soft-outputs $SO_{inner}$ from SPC SISO module 812 are then used as inputs to inner SISO module 806. The inner code may be decoded in the same way as the inner code in an SCCC is decoded, using a SISO decoding algorithm such as the well-known forward-backward algorithm mentioned above.

Next the SPC code must be decoded in the inner-outer direction, using the soft outputs of inner SISO module 806. In this direction, J soft outputs must be generated for every soft input. There are 2K/J soft-inputs (denoted $SI_{inner}$) to the SPC SISO module 812 from inner SISO module 806, and 2K soft-outputs (denoted $SO_{outer}$) to outer SISO module 804. The soft-outputs are calculated using the following expression:

$$SO_{outer}^i = g(SI_{outer}^{J\lfloor i/J \rfloor}, SI_{outer}^{J\lfloor i/J \rfloor+1}, \ldots, SI_{outer}^{J\lfloor i/J \rfloor+J-1}, SI_{inner}^{\lfloor i/J \rfloor}), \text{ for } 0 \leq i < 2K$$

These SPC soft outputs $SO_{outer}$ are de-interleaved by de-interleaver 810 before being sent to outer SISO module 804. Here, de-interleaver 810 has a block length of 2K, corresponding to the block length of interleaver 604 of encoder 600 shown in FIG. 6. Outer SISO module 804 receives the de-interleaved version of the SPC soft outputs $SO_{outer}$. The entire process described above involving soft output demapper 802, SISO module 804, inner SISO module 806, interleaver 808, de-interleaver 810, and SPC SISO module 812 may be iterated one or more times by decoder 800, to improve the soft outputs generated by outer SISO module 804.

The number iterations performed by decoder 800 may be adjustable and may be adjusted to predetermined values for different conditions, in accordance with one embodiment of the invention. For example, the number of iterations may vary depending on performance criteria such as BER performance and settings such as data frame size, coding rate, and modulation. According to one implementation, decoder 800 may be capable of being adjusted to perform between 1 and 32 iterations. Under certain conditions, 6-8 iterations yield good performance, and performing beyond 20 iterations may not provide significant performance gains.

After the appropriate number of iterations are carried out, the soft outputs from outer SISO module 804 may hard-limited by hard limiter 814 to produce the decoded bits that are output by decoder 800, in accordance with the present embodiment of the invention.

Specific Example of Decoder

A specific example of an decoder that flexibly performs decoding for different data frame sizes, coding rates, and modulations may be implemented as an application-specific integrated circuit (ASIC), in accordance with one embodiment of the invention. The structure presented previously as decoder 800 is utilized again for illustrative purposes. Here, the decoder may operate with eight default frame sizes ranging from 128 bits to 16384 bits, as listed below.

128 bits;
256 bits;
512 bits;
1024 bits;
2048 bits;
4096 bits;
8192 bits; and
16384 bits.

These data frame sizes are presented for illustrative purpose. Other sizes may also be adopted. In accordance with one embodiment of the invention, the decoder may be reprogrammed to support different sets of frame sizes. For example, the decoder may be reprogrammed to support another set of eight different frame sizes. Also, the decoder may allow the frame size to be selected from the available sizes on a frame-by-frame basis.

Here, the decoder supports eight different code rates, as listed below. These code rates are presented for illustrative purposes. Other code rates may also be used in accordance with the present invention. The decoder may also allow the code rate to be selectable on a frame-by-frame basis.

1/2;
2/3;
3/4;
4/5;
5/6;
7/8;
8/9; and
19/20.

The decoder may be capable of handling different types of modulation mappings, such as those listed below.
BPSK;
QPSK;
8PSK;
16QAM; and
16APSK These mappings are presented for illustrative purposes. Other mappings may also be adopted in accordance with the invention.

Decoder With Puncture Module

Figure 18:
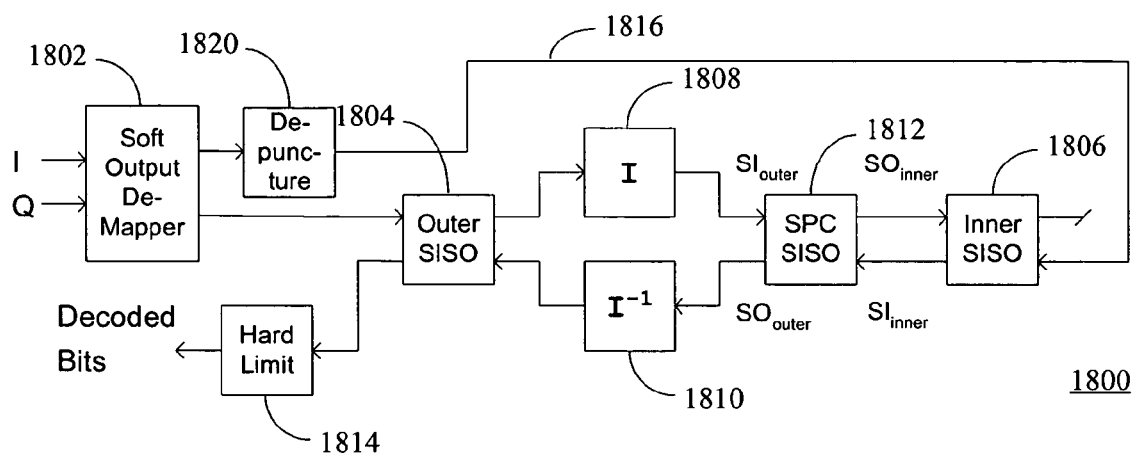
FIG. 18 is an illustrative block diagram of a decoder that contains a puncture module, for an improved error correction coding scheme according to one embodiment of the present invention.

FIG. 18 is an illustrative block diagram of a decoder 1800 that contains a puncture module, for an improved error correction coding scheme according to one embodiment of the present invention. Decoder 1800 may include components similar to those found in decoder 800. Specifically, decoder 1800 comprises a soft output demapper 1802, an outer soft-input-soft-output (SISO) module 1804, an inner SISO module 1806, an interleaver 1808, a de-interleaver 1810, a single parity check (SPC) SISO module 1812, and a hard limiter 1814.

In addition, decoder 1800 also includes a depuncture module 1820. Depuncture module 1820 performs the soft inverse of puncture module 1512. For every bit in the parity check data sequence that is deleted by puncture module 1512, depuncture module 1820 will output a parity channel metric 1816 to inner SISO module 1806 that indicates that no channel metrics are available for the corresponding parity bit (in one embodiment of the invention this will be a parity channel metric equal to zero). For every bit in the parity check data sequence that is not deleted by puncture module 1512, depuncture module 1820 will output a parity channel metric 1816 to inner SISO module 1806 that is equal to the channel metric output from the soft output demapper 1802 for the corresponding parity check data bit.

In addition to fine rate control there is a further advantage in the decoder to using puncturing. In decoder 800 the SPC SISO module 812 must receive J soft outputs from the interleaver 808, and send J soft outputs to the de-interleaver 810. If decoder 800 must support a large number of different code rates then J will take on many different values. This means that the interfaces between SPC SISO module 812, interleaver 808, and de-interleaver 810 will need to be very flexible and hence very complex. Alternatively, if puncturing is used to provide fine rate control as in decoder 1800, then complexity can be reduced.

In one embodiment of the invention 5 different values of J are used in SPC SISO module 1812 to provide coarse rate control of r=1/2 (J=2), r=2/3 (J=4), r=4/5 (J=8), r=8/9 (J=16), and r=16/17 (J=32). Periodic puncture patterns in de-puncture module 1820 of period 16 produces 9 different puncture ratios of p=16/16, p=15/16, p=14/16, p=13/16, p=12/16, p=11/16, p=10/16, p=9/16, and p=8/16 to provide fine rate control. This results in 45 overall coding rates from $r_p$=1/2 to $r_p$=32/33. This large number of code rates is achieved with just 5 different values of J, greatly simplifying the interfaces between SPC SISO module 1812, interleaver 1808, and de-interleaver 1810. Furthermore, the values of J used are restricted to powers of 2, which reduces the complexity of the interfaces further.

Special Case—Balancing Between SPC and Puncture Module

Under at least one special circumstance, the SPC module and the puncture module in encoder 1500 can be "traded off". This is the case where the inner encoder module in encoder 1500 is an accumulator, as mentioned previously. In this case the SPC SISO module and the de-puncture module in decoder 1800 can also be "traded off". Furthermore, in this case the mix of depuncture ratio in depuncture module 1820 and J in SPC SISO module 1812 does not need to match the mix of puncture ratio in puncture module 1512 and J in SPC module 1508 (although the total effect must match). This means that the SPC SISO module and de-puncture module in decoder 1800 can be "traded off" independently of what is done in encoder 1500.

This trade off in decoder 1800 can be used to reduce complexity. As mentioned previously the total number of different values of J used in SPC module 1812 can be reduced by increasing the number of different puncture ratios used in de-puncture module 1820, in such a way that the overall coding rate is the same. This reduction in the number of different values of J will reduce the complexity of the interfaces between SPC module 1812, interleaver 1808, and de-interleaver 1810.

Specific Example of Decoder With Puncture Module

A specific example of an decoder that flexibly performs encoding for different data frame sizes, coding rates, and modulations, may be implemented as a Field Programmable Gate Array (FPGA), in accordance with one embodiment of the invention. The structure presented previously as encoder 1800 is utilized again for illustrative purposes. Here, the decoder may operate with eight default frame sizes ranging from 128 bits to 16384 bits, as listed below. Each data frame refers to a collection of data organized as a group for processing.
128 bits;
256 bits;
512 bits;
1024 bits;
2048 bits;
4096 bits;
8192 bits; and
16384 bits.

These data frame sizes are presented for illustrative purpose. Other sizes may also be adopted. In accordance with one embodiment of the invention, the decoder may be reprogrammed to support different sets of frame sizes. For example, the decoder may be reprogrammed to support another set of eight different frame sizes. Also, the decoder may allow the frame size to be selected from the available sizes on a frame-by-frame basis.

Here, the decoder supports 45 different code rates. These 45 code rates are derived from a combination of coarse rate control and fine rate control. The coarse rate control is controlled by varying r, where r=J/(J+2) is the rate of the unpunctured code set by the value of J in SPC module 1508. There are 5 possible values of r:
r=1/2 (J=2);
r=2/3 (J=4);
r=4/5 (J=8);
r=8/9 (J=16); and
r=16/17 (J=32).

These rates are presented for illustrative purposes. Other code rates may also be used in accordance with the present invention. The fine rate control is controlled by varying p, where p is the puncture ratio used in the de-puncture module 1520. There are 9 possible values of p:
p=16/16;
p=15/16;
p=14/16;
p=13/16;
p=12/16;

p=11/16;
p=10/16;
p=9/16; and
p=8/16.

These ratios are presented for illustrative purposes. Other puncture ratios may also be used in accordance with the present invention. The overall coding rate of decoder 1800 may be expressed as $r_p = r/(r+p(1-r))$.

The decoder may be capable of handling different types of modulation mappings, such as those listed below.
BPSK;
QPSK;
b 16QAM;
b 64QAM; and
b 256QAM.

These mappings are presented for illustrative purposes. Other mappings may also be adopted in accordance with the invention.

Performance

FIGS. 9-14 show performance results demonstrating the performance and flexibility of an improved error correction coding scheme in accordance with one embodiment of the invention. These performance results correspond to an implementation of the decoder using a specific ASIC design. The results reflect measurements which include implementation losses. Accordingly, an ideal implementation of may achieve better performance than that shown in these figures. The ASIC used for these measurements utilize a Structured ASIC design, as is well known in the art. This ASIC is implemented with a system clock speed of 105 MHz. In another embodiment, the ASIC may utilize a Standard Cell ASIC design, which is also well known in the art. Such a design may facilitate a higher clock speed and thus higher throughput.

Figure 9:
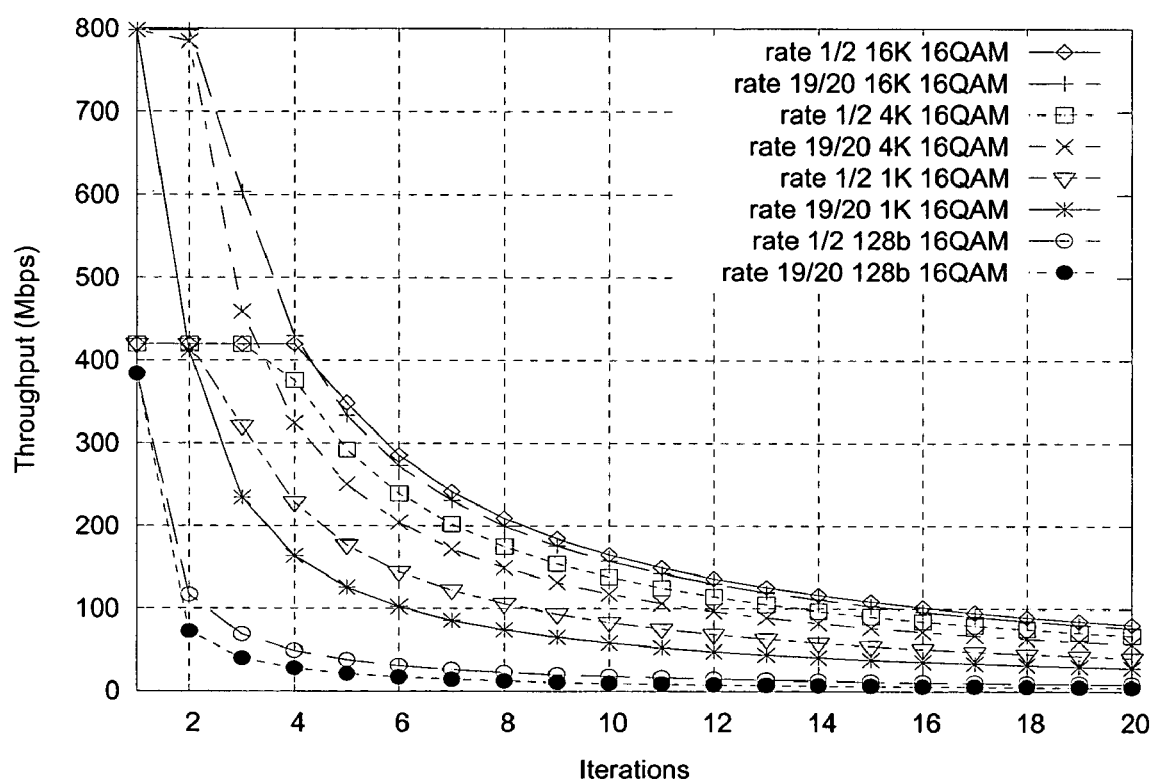
FIG. 9 demonstrates the throughput performance of a decoder for the improved error correction coding scheme, according to one embodiment of the present invention.

FIG. 9 demonstrates the throughput performance of a decoder for the improved error correction coding scheme, according to one embodiment of the present invention. For various combinations of coding rate, frame size, and modulation scheme, throughput is plotted against the number of iterations performed by the decoder.

Figure 10:
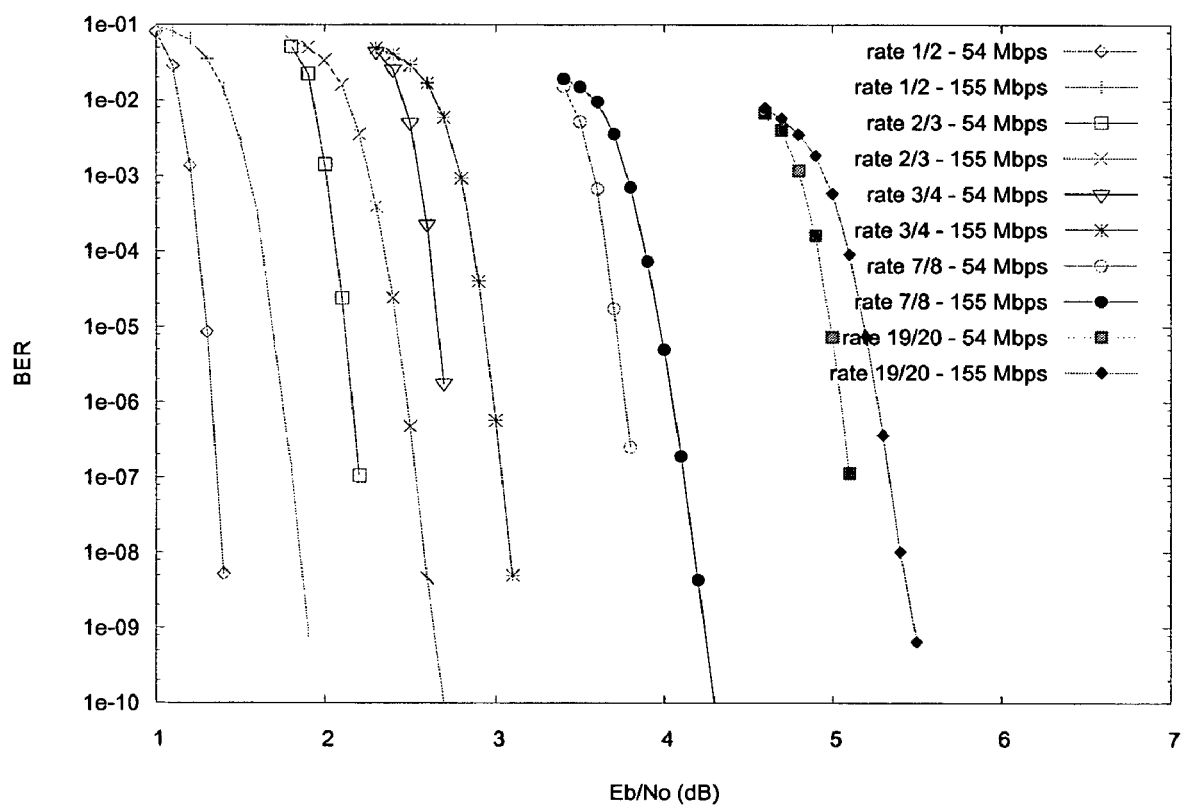
FIG. 10 demonstrates the code rate flexibility of a decoder for the improved error correction coding scheme, according to one embodiment of the present invention.

FIG. 10 demonstrates the code rate flexibility of a decoder for the improved error correction coding scheme, according to one embodiment of the present invention. This figure shows the performance of the decoder with QPSK modulation, a frame size of 16K bits, and a range of code rates from rate 1/2 to rate 19/20. These codes rates are selected for illustrative purposes. In at least one embodiment of the invention, the decoder supports more rates than those shown in the figure. Results for two different numbers of iterations are shown for each case: Sufficient iterations to support 54 Mbps operation; and sufficient iterations to support 155 Mbps operation.

Figure 11:
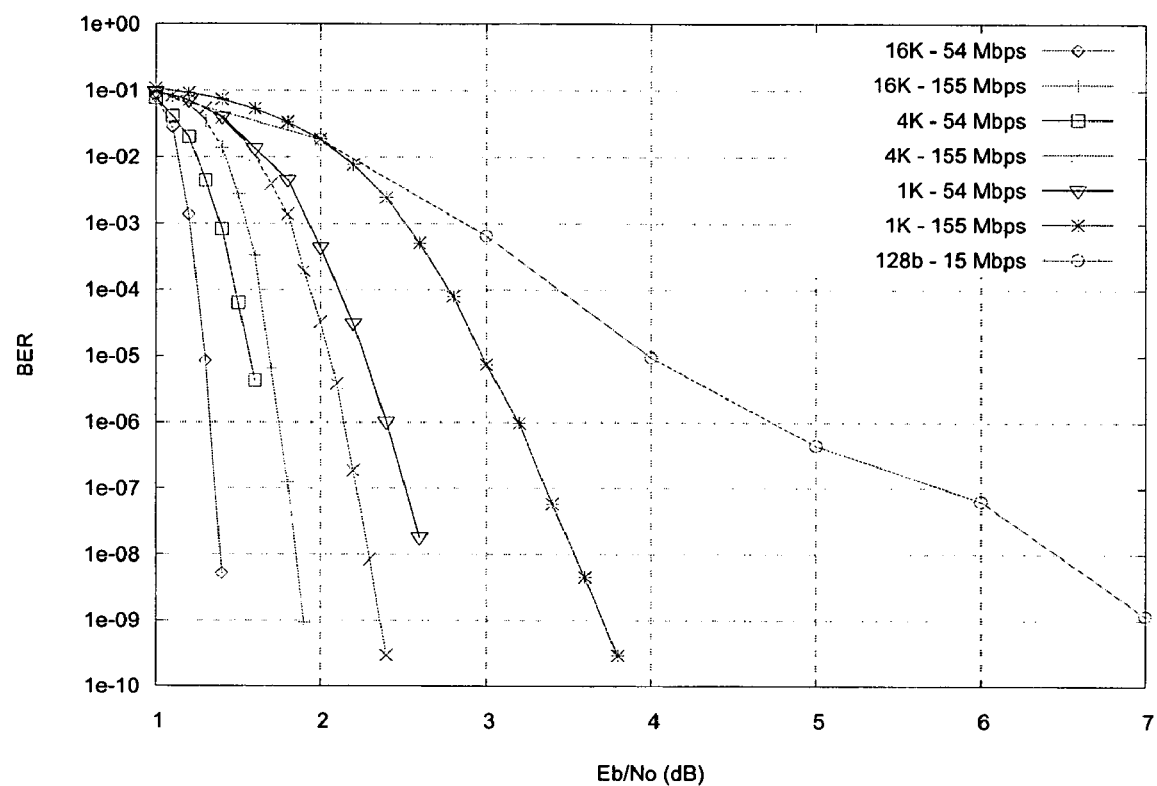
FIG. 11 demonstrates the frame size flexibility of a decoder for the improved error correction coding scheme, according to one embodiment of the present invention.

FIG. 11 demonstrates the frame size flexibility of a decoder for the improved error correction coding scheme, according to one embodiment of the present invention. This figure shows the performance of the decoder with QPSK modulation, a code rate of 1/2, and a range of frame sizes from 16K bits down to 128 bits. These frame sizes are shown for illustrative purposes. In at least one embodiment of the invention, the decoder supports more frame sizes than those shown in the figure. Results for two different numbers of iterations are shown for each case: Sufficient iterations to support 54 Mbps operation; and sufficient iterations to support 155 Mbps operation (except the 128 bit case, which has a reduced throughput due to higher overheads in the decoder).

Figure 12:
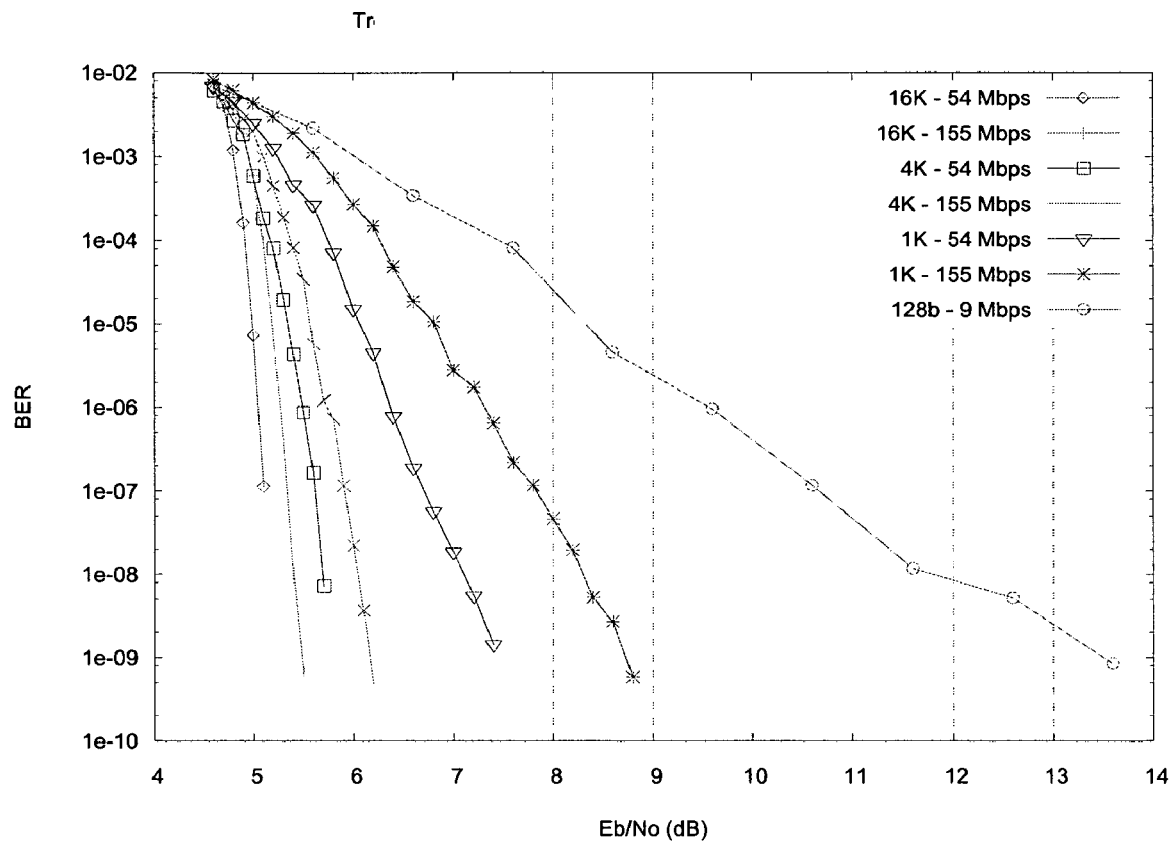
FIG. 12 demonstrates the frame size flexibility, at an extreme code rate, of a decoder for the improved error correction coding scheme, according to one embodiment of the present invention.

FIG. 12 demonstrates the frame size flexibility, at an extreme code rate, of a decoder for the improved error correction coding scheme, according to one embodiment of the present invention. This figure shows the performance of the decoder with QPSK modulation, a code rate of 19/20, and a range of frame sizes from 16K bits down to 128 bits. Again, the decoder may support more frame sizes than those shown in the figure. Results for two different numbers of iterations are shown for each case: Sufficient iterations to support 54 Mbps operation; and sufficient iterations to support 155 Mbps operation (except the rate 19/20 case, which has a reduced throughput).

Figure 13:
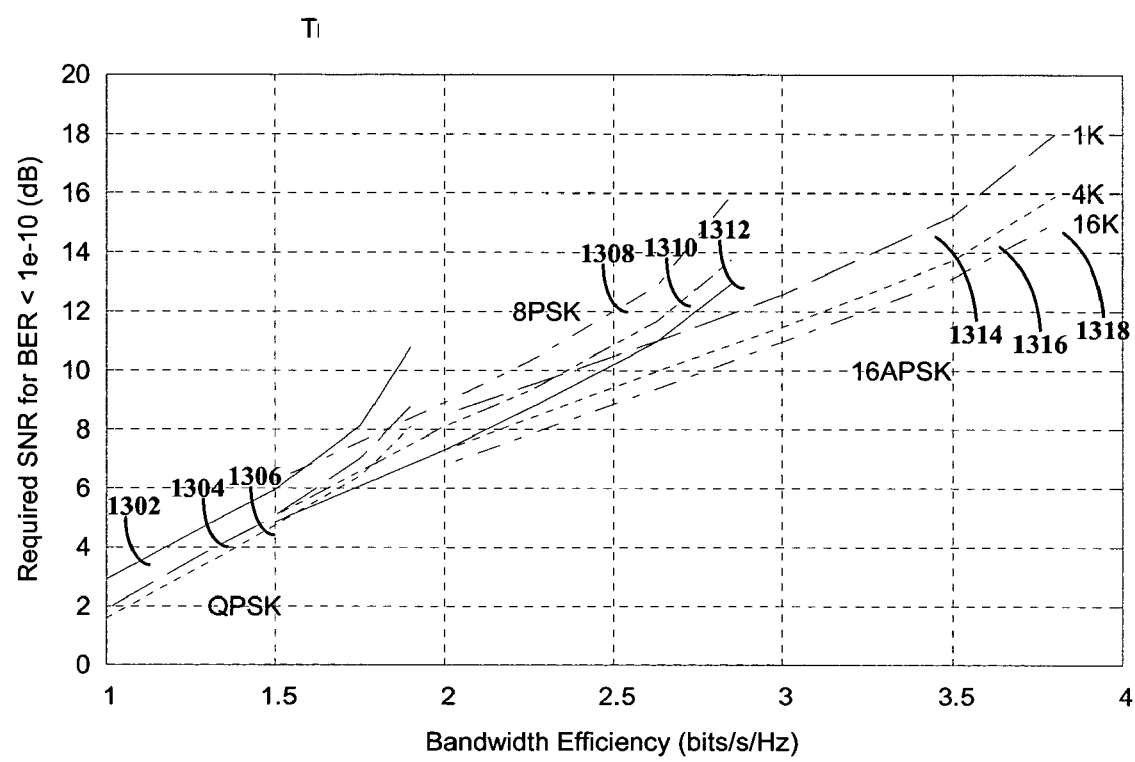
FIG. 13 demonstrates the modulation flexibility of a decoder for the improved error correction coding scheme, according to one embodiment of the present invention.

FIG. 13 demonstrates the modulation flexibility of a decoder for the improved error correction coding scheme, according to one embodiment of the present invention. This figure plots the required SNR (Eb/No) for a BER of 10-10 against bandwidth efficiency (measured as throughput per Hz of occupied bandwidth) for QPSK, 8PSK and 16APSK modulations and a range of frame sizes (the FlexiCode ASIC can also support BPSK and 16QAM). Specifically, curves 1302, 1304, and 1306 correspond to QPSK and frame sizes 1K, 4K, and 16K, respectively. Curves 1308, 1310, and 1312 correspond to 8PSK and frame sizes 1K, 4K, and 16K, respectively. Curves 1314, 1316, and 1318 correspond to 16APSK and frame sizes 1K, 4K, and 16K, respectively. Sufficient iterations have been used to support a throughput of 54 Mbps.

Figure 14:
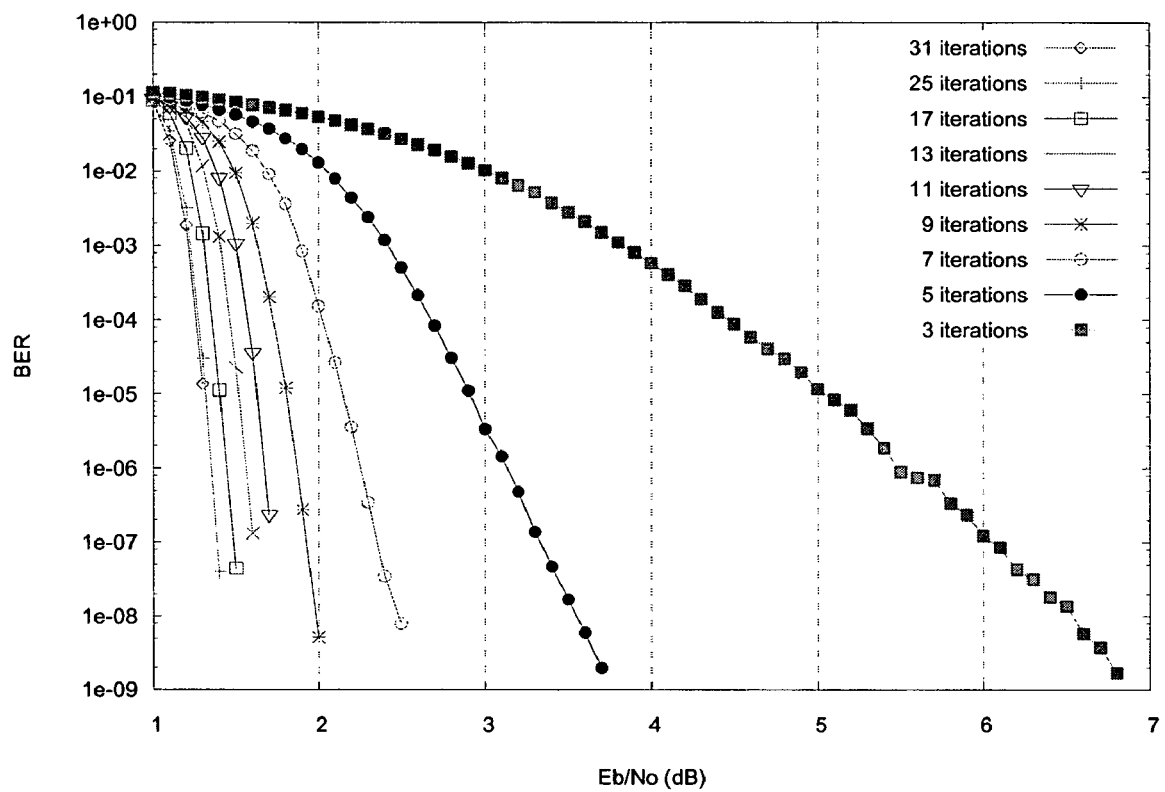
FIG. 14 demonstrates the convergence properties of a decoder for the improved error correction coding scheme, according to one embodiment of the present invention.

FIG. 14 demonstrates the convergence properties of a decoder for the improved error correction coding scheme, according to one embodiment of the present invention. This figure shows the performance of the decoder with QPSK modulation, a code rate of 1/2, a frame size of 16K bits, and a range of iterations. As can be seen there is only 0.2 dB gained from going from 11 iterations to 17 iterations, and only 0.1 dB gained from increasing the iterations beyond 17.

Performance With Puncture Module

Figure 19:
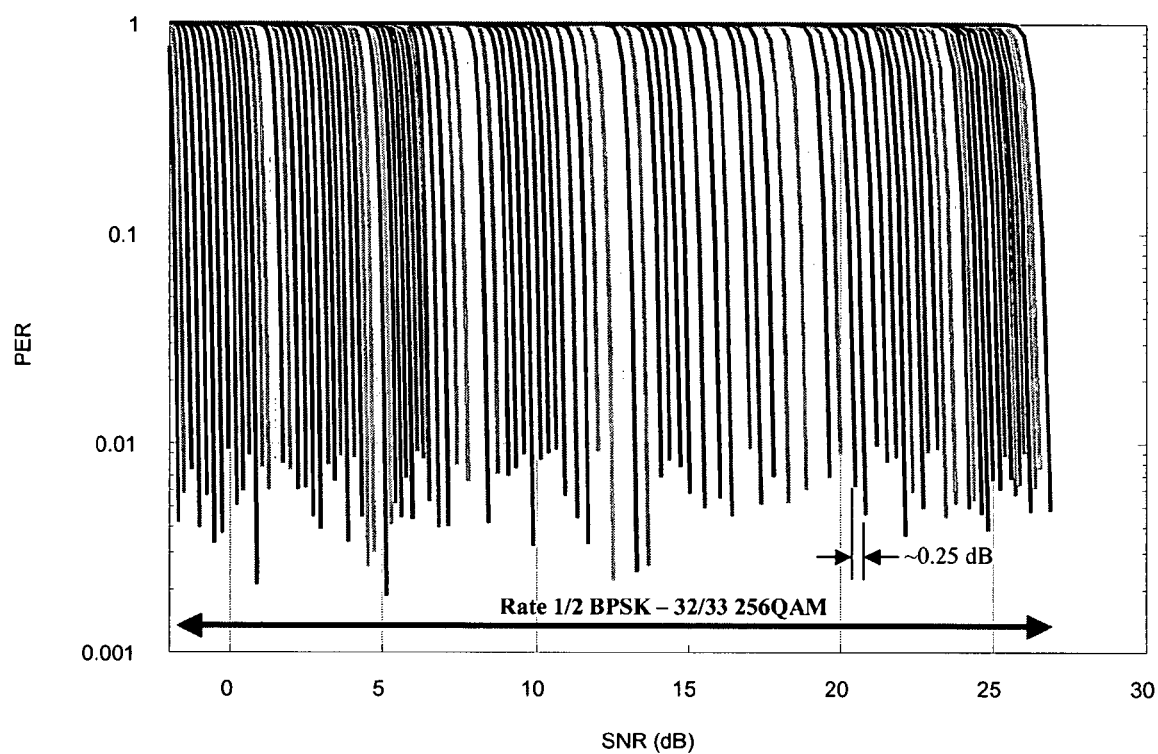
FIG. 19 demonstrates the code rate flexibility of a decoder with a puncture module for the improved error correction coding scheme, according to one embodiment of the present invention.
Figure 20:
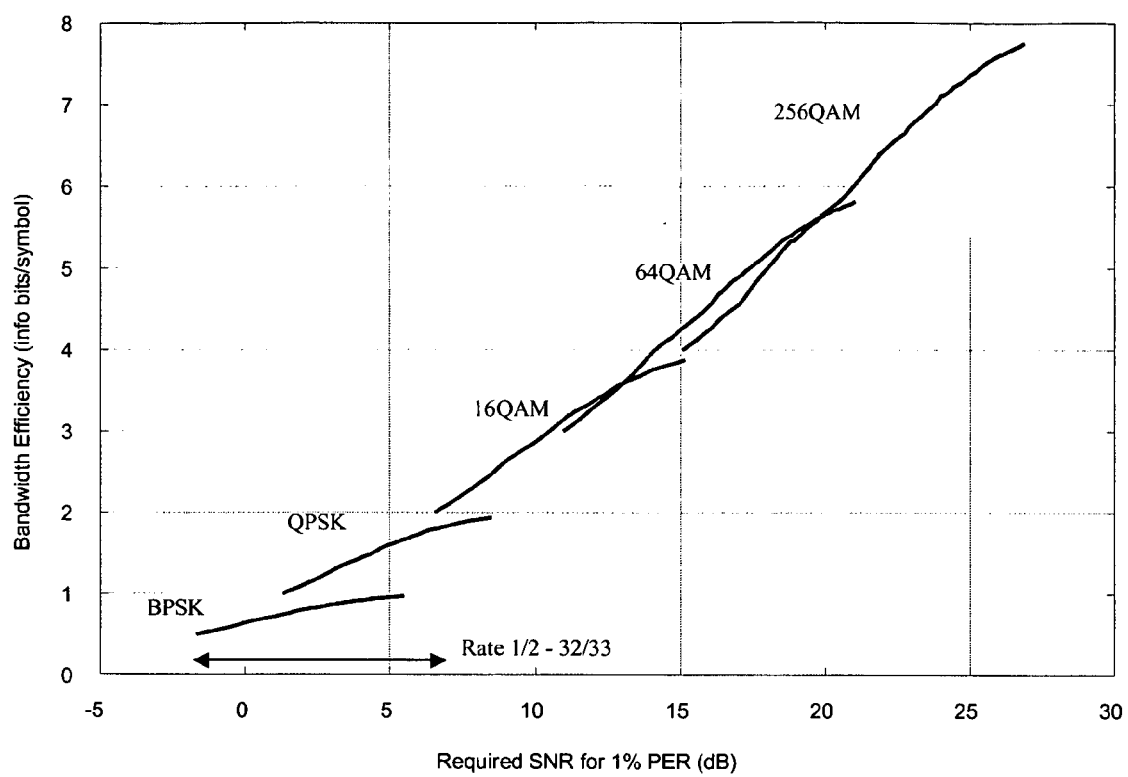
FIG. 20 further demonstrates the code rate flexibility of a decoder with a puncture module for the improved error correction coding scheme, according to one embodiment of the present invention.
Figure 21:
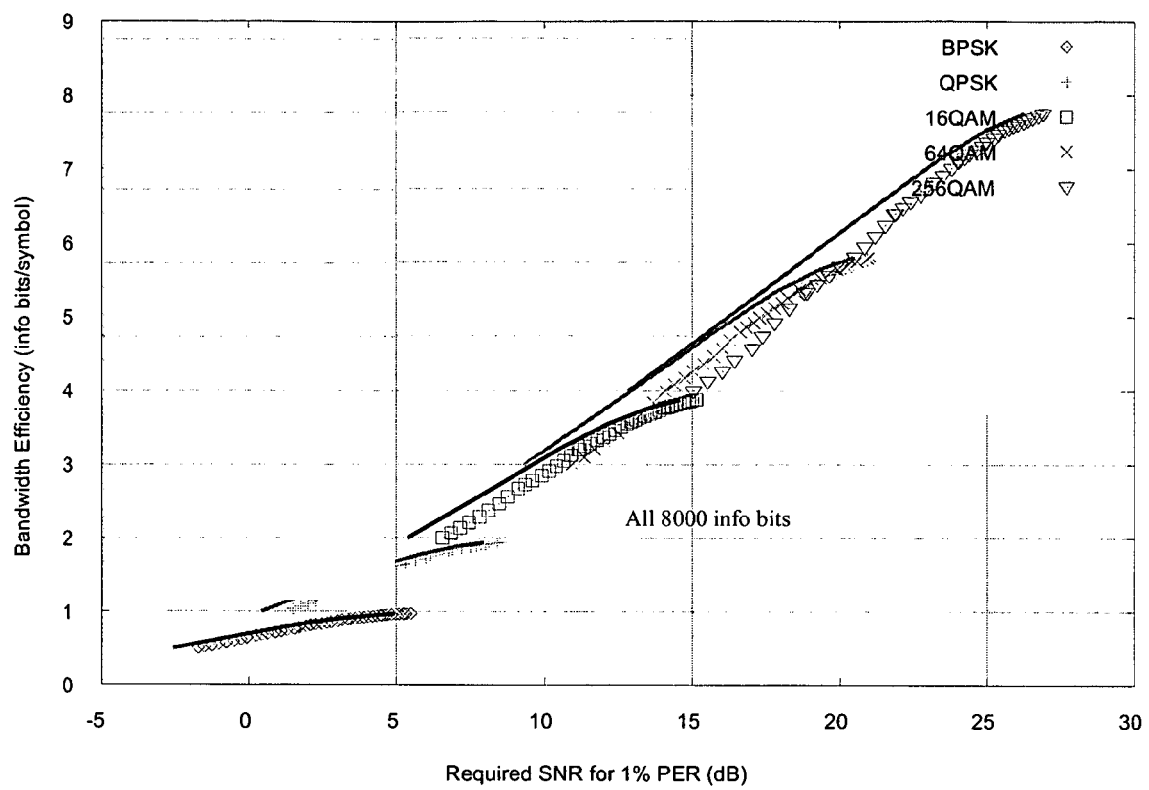
FIG. 21 further demonstrates the code rate flexibility of a decoder with a puncture module for the improved error correction coding scheme, according to one embodiment of the present invention.

FIGS. 19-21 show performance results demonstrating the performance and rate flexibility of an improved error correction coding scheme in accordance to one embodiment of the invention. These performance results correspond to an implementation of the decoder 1800 that has 45 code rates resulting from 5 different values of J used in SPC SISO module 1812 to provide coarse rate control of r=1/2 (J=2), r=2/3 (J=4), r=4/5 (J=8), r=8/9 (J=16), and r=16/17 (J=32) and a periodic puncture pattern in de-puncture module 1820 of period 16 producing 9 different puncture ratios of p=16/16, p=15/16, p=14/16, p=13/16, p=12/16, p=11/16, p=10/16, p=9/16, and p=8/16 to fine rate control. This results in 45 overall coding rates from $r_p=1/2$ to $r_p=32/33$. This is combined with modulation mappings BPSK, QPSK, 16QAM, 64QAM, and 256QAM in the soft demapper 1802.

FIG. 19 shows the Packet Error Rate (PER) as a function of Signal to Noise Ratio (SNR) for many combinations of overall coding rate and modulation mapping, according to one embodiment of the present invention. This figure shows that a 1% PER can be achieved from −2 dB SNR to 27 dB SNR in approximately 0.25 dB steps.

FIG. 20 shows the Bandwidth Efficiency as a function of SNR required to achieve a 1% PER for many combinations of overall coding rate and modulation mapping, according to one embodiment of the present invention. This figure shows that a very wide range of bandwidth efficiencies can be achieved through the fine rate control possible with this invention.

FIG. 21 shows in the same results as FIG. 20 and compares the performance results to the finite block size bound, according to one embodiment of the present invention. Measured performance is shown as points, and the bounds are shown as lines. This figures shows that the fine coding rate flexibility does not result in performance penalties.

Implementing the Decoder as an LDPC

For embodiments of the invention that employ binary, linear, two state convolutional codes for both the inner and outer codes, the code structure can be described fully by a set of binary parity check equations. This set of parity check equations can be expressed in matrix form providing a generalization of the parity check matrix equation that is standard in the error control coding literature (for example see: S. Lin and D. Costello, Jr., *Error Control Coding: Fundamentals and Applications*, Prentice Hall, 1983). The generalization of the parity check matrix corresponding to this set of parity check equations is defined as the extended parity check matrix. This terminology has been selected to emphasize the fact that the extended parity check matrix involves binary variables that are not outputs of encoder 600.

The resulting extended parity check matrix for encoder 600 has a low density of ones. Therefore, expressing the code structure in terms of such a low-density extended parity check matrix equation allows one to employ iterative message passing decoding algorithms and architectures developed for Low Density Parity Check Codes (LDPC Codes).

The extended parity check representation of the code produced by encoder 600 when binary, linear, two-state convolutional constituent codes are used results from the fact that the state of the constituent encoders is a binary variable and can be included in the parity check equations as an auxiliary or hidden variable. An auxiliary or hidden variable is one that is not part of the encoded binary codeword comprising 614 and 616.

Figure 16A:
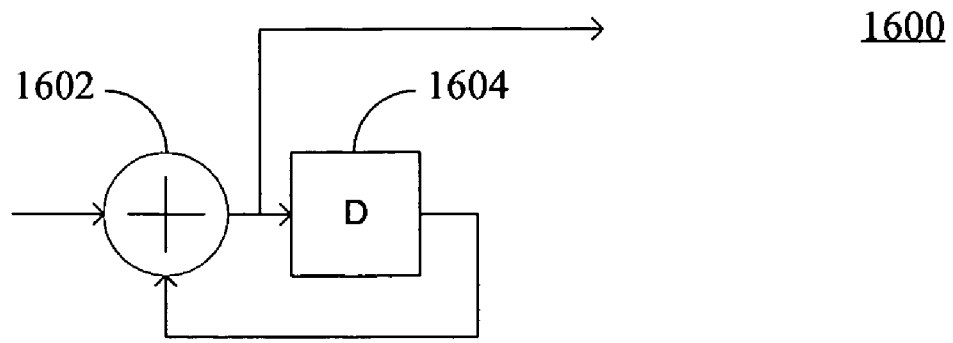
FIG. 16A is an illustrative block diagram of a recursive rate 1/1, 2-state convolutional code, also known as an accumulator, which can be used as the inner or outer encoder according to one embodiment of the present invention.
Figure 16B:
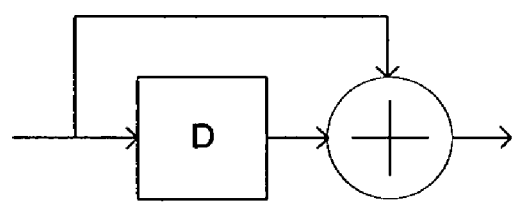
FIG. 16B is an illustrative block diagram of a feed-forward rate 1/1, 2-state convolutional code, which can be used as the inner or outer encoder according to one embodiment of the present invention

Linear Binary Two-State Convolutional Codes Described by Low-Density Binary Matrices Consider a binary, linear, two-state convolutional code that maps k input bits to n output bits. Denote the input bits by $b_i$ for i=0, 1, ... k−1 and the output bits by $c_j$ for j=0, 1, ... n−1. Furthermore, let the (k×1) column vector b comprise the k input bits and the (n×1) column vector c comprise the n output bits. If the convolutional code is non-recursive (feed-forward), then the following holds:

$$c = Gb \quad (1)$$

where G is an (n×k) matrix that is low density (i.e., has much fewer than nk ones). To show that this is so, note that the only generator polynomials of interest for a binary, linear, two-state non-recursive code are $g_0(D)=1$ and $g_1(D)=1+D$. An encoder block diagram for generator $g_1(D)=1+D$ is shown in FIG. 16B. All other primitive generators are trivial shifts (delays) of these two. Consider a rate 1 code with generator $g_0(D)$. In this case, the matrix G is simply the identity matrix (which is low density). Consider a rate 1 code with generator $g_1(D)$ so that the encoding rule is $c_i = b_i + b_{i-1}$, where the sum is taken modulo two. It follows that the matrix G has the following form $$G = \begin{bmatrix} 1 & 0 & 0 & 0 & \ldots & 0 & 0 & X \\ 1 & 1 & 0 & 0 & \ldots & 0 & 0 & 0 \\ 0 & 1 & 1 & 0 & 0 & \ldots & 0 & 0 \\ 0 & 0 & 1 & 1 & 0 & 0 & \ldots & 0 \\ 0 & 0 & 0 & 1 & 1 & 0 & \ldots & 0 \\ \vdots & & & & \ddots & \ddots & & \vdots \\ 0 & 0 & \ldots & 0 & 0 & 1 & 1 & 0 \\ 0 & 0 & 0 & \ldots & 0 & 0 & 1 & 1 \end{bmatrix} \quad (2)$$

where X is one if the encoder is terminated using tail-biting in one embodiment of the invention, and zero if no termination is used in another embodiment of the invention.

For code rates lower than 1, the linear, two-state non-recursive encoder will be some combination of $g_0(D)$ and $g_1(D)$. As an example, consider the case of a rate ½ encoder with one output bit generated by $g_0(D)$ and the other generated by $g_1(D)$. In this case the (2k×k) matrix G will have rows that are alternately drawn from the (k×k) identity matrix and from the matrix in (Eq. 2). Specifically, the matrix G will have the form $$G = \begin{bmatrix} 1 & 0 & 0 & 0 & \ldots & 0 & 0 & 0 \\ 1 & 0 & 0 & 0 & \ldots & 0 & 0 & X \\ 0 & 1 & 0 & 0 & 0 & \ldots & 0 & 0 \\ 1 & 1 & 0 & 0 & 0 & 0 & \ldots & 0 \\ 0 & 0 & 1 & 0 & 0 & 0 & \ldots & 0 \\ 0 & 1 & 1 & 0 & 0 & 0 & \ldots & 0 \\ \vdots & \vdots & & \ldots & & & & \vdots \\ 0 & 0 & & & \ldots & 0 & 0 & 0 & 1 \\ 0 & 0 & & & \ldots & 0 & 0 & 1 & 1 \end{bmatrix} \quad (3)$$

where the first output bit of the encoder is generated by $g_0(D)$, the second output bit is generated by $g_1(D)$ and then successive output bits alternate between these two generators.

It should be noted that the order of the rows in the matrix G in (Eq. 3) corresponds to the order of the serialization of the coded bits. In the specific embodiment illustrated in (Eq. 3), output bits with even time indices are generated by $g_0(D)$ and output bits with odd time indices are generated by $g_1(D)$. Other bit serialization are possible and different orderings will result in corresponding permutations of the rows of G.

If the binary, linear, two-state encoder is recursive, then the generators are either $g_0(D)$ or $g_2(D)=1/(1+D)$. All other primitive generators are trivial delays of this encoder operation. A rate one code with generator $g_2(D)$ which is also referred to as an accumulator since the current output bit is the running modulo two sum of the current and previous inputs. A block diagram for the encoder of an accumulator is shown in FIG. 16A. Specifically, for a rate 1 accumulator, the output is $c_i = c_{i-1} + b_i$. For such a recursive encoder, the following holds $$b = Sc \quad (4)$$

where S is an (k×n) matrix that is low density. Consider a rate 1 recursive encoder with generator $g_0(D)$, in this case S is the identity matrix. Consider a rate one accumulator, then S is exactly the same form as the matrix given in (2) with X=0.

Note that this is a result of the fact that encoders with $g_1(D)$ and $g_2(D)$ are inverse mappings of each other. Any binary, linear, two-state recursive encoder with rate less than 1 will have a mixture of bits generated by $g_0(D)$ and $g_2(D)$. As a result, the matrix S will have rows that are drawn from the matrix in (Eq. 2) and the identity matrix. For example, a rate ½ code with one output generated by $g_0(D)$ and the other generated by $g_2(D)$ will have an S matrix equal to the matrix in (Eq. 3). As with G this is one specific embodiment of S, and other mixtures of $g_0(D)$ and $g_2(D)$ are possible.

Note that the expression in (Eq. 4) can also be written as $c=S^{-1}b$, where $S^{-1}$ is the inverse of the matrix S. However, the form in (Eq. 4) is preferable in this case because S is a low-density binary matrix whereas $S^{-1}$ has roughly half of its elements equal to 1.

In summary, any binary, linear two-state convolutional code can be described by a low density binary matrix relating the vectors of input and output bits. In the special case of encoder 600 where outer encoder 602 and inner encoder 610 are both binary, linear two-state convolutional codes it is possible to describe both outer encoder 602 and inner encoder 610 by low density binary matrices relating the vectors of input and output bits.

Other Encoder Operations Described by Low-Density Binary Matrices

Interleaver 604 and single parity check (SPC) module 608 in encoder 600 can also be described as low density binary matrix relating the vectors of input and output bits.

An interleaver is a permutation device so that there is a one to one relationship between input and output bits. Let b and c denote (m×1) vectors of bits at the input and output of an interleaver, respectively. Then the following holds $$c = Pb \quad (5)$$

where P is an (m×m) permutation matrix. A permutation matrix has elements that are either 0 or 1 and also has exactly one 1 in each row and column. The interleaver operation is defined by $c_i = b_{I(i)}$ where $I(i)$ is a permutation of the indices $\{0, 1, \ldots m-1\}$. Thus, (Eq. 5) holds with the matrix P having a 1 in the $I(i)$ column of row i. Here the convention assumed that rows and columns are indexed by $\{0, 1, \ldots m-1\}$. Since $I(i)$ is a permutation, P is a permutation matrix.

The SPC module 608 can also be described using a sparse binary matrix. For a given parameter J in SPC module 608 of encoder 600, let the input bits to the SPC be denoted as $b_i$ and the output bits denoted as $c_j$. These variables can be expressed as vectors. Let b be the (m×1) vector of input bits to the SPC module and c be the (v×1) vector of output bits of the SPC module. Here v=m/J since for each J bits input to the SPC module, there is one output. The encoding rule for the SPC module is $$c_j = b_{jJ} + b_{jJ+1} + b_{jJ+2} + \ldots + b_{jJ+J-1} \quad (6)$$

where the sum in modulo two. It follows that the input-output relation can be described using $$c = Jb \quad (7)$$

where J is an (v×m) matrix defined by $$J = \begin{bmatrix} 1 & 1 & \ldots & 1 & 0 & 0 & \ldots & 0 & & \ldots & & 0 & 0 & \ldots & 0 \\ 0 & 0 & \ldots & 0 & 1 & 1 & \ldots & 1 & 0 & 0 & \ldots & 0 & 0 & 0 & \ldots & 0 \\ 0 & 0 & \ldots & 0 & 0 & 0 & \ldots & 0 & 1 & 1 & \ldots & 1 & \vdots & \vdots & & \vdots \\ \vdots & \vdots & & \vdots & & & & & & & & & \ddots & 0 & 0 & \ldots & 0 \\ 0 & 0 & & 0 & & & & \ldots & & & & 0 & 0 & \ldots & 0 & 1 & 1 & \ldots & 1 \end{bmatrix} \quad (8)$$

so that row i has J consecutive ones starting at column iJ and all other entries are zero.

A repetition operation can also be represented as a low density parity operation. A repetition operation is of interest when a convolutional code has more than one output bit generated by the same generator polynomial. A repetition operation is defined such that the output $c_j$ is $$c_{iL} = c_{iL+1} = \ldots = c_{iL+L-1} = b_i \quad (9)$$

where $b_i$ is the input bit sequence and L is the number of times each bit is repeated. It follows that, in matrix vector form, this is $$c = R_L b \quad (10)$$

where the (Lm×m) matrix $R_L$ is the matrix obtained by taking the transpose of the matrix in (Eq. 8) and setting J=L. In other words, column j of $R_L$ has L consecutive ones, starting at row $L_j$ and all other entries are zero.

The Extended Parity Check Matrix

For embodiments of the encoder 600 with inner and outer codes defined as binary, linear, two-state convolutional codes, the entire code structure can be described using a sparse binary matrix relating the codeword bits and some auxiliary or hidden bits. This is best illustrated by an example.

Consider the embodiment of encoder 600 where the outer code 602 is rate ½ with both output bits at a given time generated by $g_1(D)=1+D$. Denote the (K×1) vector of input bits 616 to the outer code by b. Since each of the outer code output bits at a given time are equal, this may be modeled as a (K×1) vector of output bits c, each of which is repeated. Denote the resulting (2K×1) vector by d. Note that d is the input to the interleaver 604. From the above development, it is clear that c=Gb and d=$R_2$c, where G is the (K×K) matrix in (Eq. 2) and $R_2$ is the (2K×K) repeat matrix with L=2. Let vector of bits at the output of the interleaver 604 is Pd and the vector of output bits of the SPC module 608 is e=J(P$R_2$c). The bits in e are the input to the inner code 610. For this embodiment, we consider an accumulator inner code so that the output bits of the inner code in vector form are p. It follows from (Eq. 4) that these bits satisfy Sp=e.

In summary, any codeword generated by encoder 600 when the outer code is rate ½, with both outputs generated by $g_1(D)=1+D$, and the inner code selected to be an accumulator must satisfy $$c=Gb \text{ and } e=J(PR_2c) \text{ and } Sp=e \qquad (11)$$

or equivalently, $$\begin{bmatrix} S & JPR_2 & 0 \\ 0 & I & G \end{bmatrix} \begin{bmatrix} p \\ c \\ b \end{bmatrix} = 0 \qquad (12)$$

where all arithmetic is performed modulo two. Denote the matrix in (Eq. 12) by H'; this is the extended parity check matrix.

The relation in (Eq. 12) is a set of parity check equations in matrix form involving the codeword bits—these are the elements of p (614) and b (616)—along with a set of auxiliary variables defined by c. The relation in (Eq. 12) is written in matrix-partitioned form and it is useful to review the dimensions for this embodiment. The vectors p, c, and b are (V×1), (K×1), and (K×1), respectively, where K is the number of input bits and V=2K/J is the number of parity bits (614). The matrices S and G are the dual-diagonal structure of (Eq. 2) with dimensions (V×V) and (K×K), respectively. The matrix $JPR_2$ has dimension (V×K). It follows that, for this specific example, H' has dimension (N×N+K). More generally, H' has dimension ((N−K+A)×(N+A)), where A is the number of auxiliary (hidden variables). Note that since V is the number of parity bits and N is the total number of bits in the codeword, V+K=N, and this fact has been used.

The relation in (Eq. 12) is similar to a LDPC equation. The main difference is the presence of the auxiliary or hidden variables defined in c. For this reason we refer to the matrix in (Eq. 12) as an extended parity check matrix and the equation in (Eq. 12) as an extended parity check equation. The dimension of a standard parity check matrix is ((N−K)×N). Thus, an extended parity check matrix with A auxiliary variables has A more rows and A more columns than a standard parity check matrix.

Since all operations of encoder 600 can be represented as sparse binary matrix multiplication when binary, linear, two-state convolutional codes are used for inner and outer codes, an extended parity check equation of a form similar to (Eq. 12) is possible. There is some flexibility in selecting the set of auxiliary variables. In the example described, we selected the hidden variables to be K output bits of the outer code. In general, it is desirable to select the set of auxiliary variables such that as few as possible are used while maintaining a structure for the extended parity check matrix that has no cycles of length 4. A cycle of length four occurs when two rows of the matrix have a one in the same two columns.

Standard Parity Check Matrix Equation and Iterative Decoding

Figure 22:
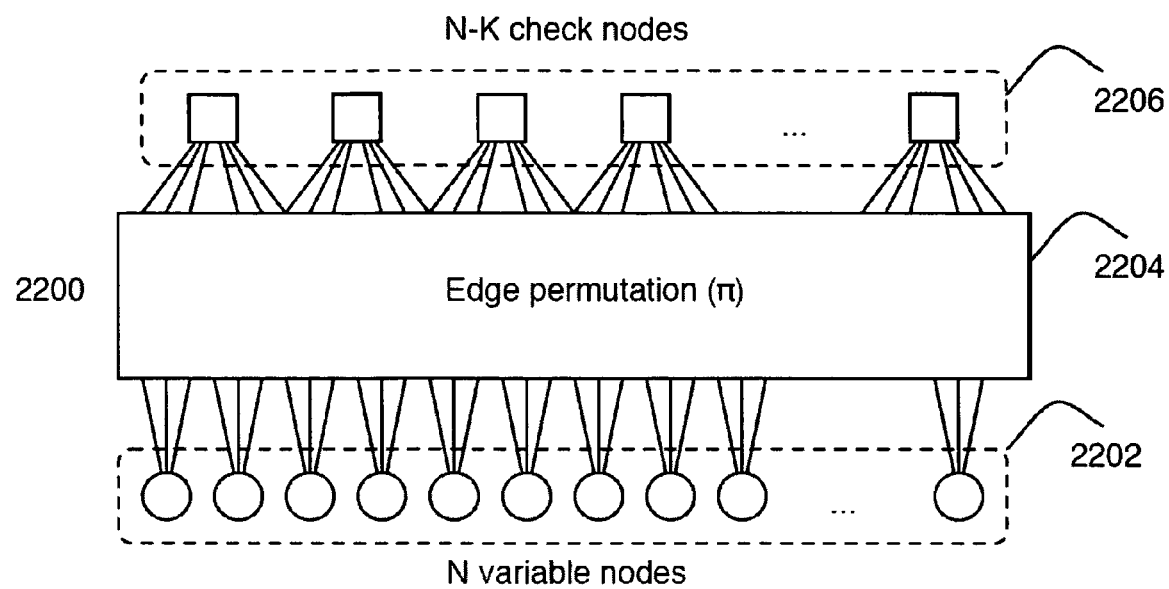
FIG. 22 shows an illustrative graphical model that can be used to represent the parity check equations of a low density parity check code.

Parity check equations with low density can be used to decode the code via a set of standard iterative message passing rules. This method of decoding is well understood in the field for decoding of LDPC Codes. For example, this method is described in detail in in R. G. Gallager, "Low density parity check codes," *IEEE Transaction on Information Theory*, vol. 8, January 1962, pp. 21-28 and D. J. C. MacKay and R. M. Neal, "Near Shannon limit performance of low density parity check codes," *IEE Electronic Letters*, vol. 32, no. 18, August 1996, pp. 1645-1646. The decoding method is based on constructing a parity check graph based on a parity check equation of the form $$Hx=0 \qquad (13)$$

Where x is any valid codeword for the LDPC code and H is a low density parity check matrix with dimension ((N−K)×N), where there are K input bits and N output bits. Such a LDPC equation corresponds in a one to one manner with a parity check graph as shown in FIG. 22. There are two types of nodes in the parity check graph of FIG. 12: variable nodes (2202) and check nodes (2206). Each variable node is connected to one or more check node by a set of edges that are permuted through a predetermined edge permutation (2204). The pattern of connections in the parity check graph is defined by the form of the H matrix in (Eq. 13). Specifically, if the element in row i and column j of H is a one, then the $i^{th}$ check node will be connected to the $j^{th}$ variable node; otherwise there is no edge connecting these nodes. It follows that there are N variable nodes, corresponding to the number of codeword bits in x and (N−K) check nodes, corresponding to the number of rows in the parity check matrix H.

Decoding of an LDPC code is performed by iteratively updating messages along the edges of the parity check graph. At the start of decoding a message is available for each code bit from the channel observation. Denote the channel message for code bit $x_j$ by M[j]. Consider the message update at variable node j and assume that this variable node is connected to D check nodes (i.e., has degree D). Messages will be accepted along the D edges connected to the variable node. Denote these messages as $MD_j[0]$, $MD_j[1]$, ... $MD_j[D-1]$. The message update performed at the variable node produces a set of outgoing messages, denoted by $MU_j[0]$, $MU_j[1]$, ... $MU_j[D-1]$. The update rule is $$MU_j[i]=(MD_j[0]+MD_j[1]+ \ldots MD_j[i-1]+MD_j[i+1]+\ldots MD_j[D-1])+M[j] \qquad (14)$$

In words, the outgoing message along a given edge is the sum of incoming messages along all other edges, plus the channel message.

Processing of the check nodes is similar to the SPC SISO processing. Specifically, for a check node with D edges connected, messages along each edge will be accepted. Let these incoming messages be denoted by MI[0], ... MI[D−1]. Then, the message update performed at a check node produces an outgoing message along each edge connected to the check node. Denote these messages as MO[0], ... MO[D−1]. This update is $$MO[i]=g(MI[0],MI[1],\ldots MI[i-1],MI[i+1],\ldots MI[D-1]) \qquad (15)$$

Where g(.) is the function defined previously. In words, the outgoing message along each edge is the g-function of all messages incoming over the other edges.

It should be noted that the degree of each variable node can be different. Similarly, the degree of each check node can be different. For the embodiment 2200, the variable node degree is shown fixed at 3, while the check degree value is also fixed for all check nodes at 6. More generally, these values can differ for each check and variable node. Such LDPC codes are known as irregular LDPC codes and are well studied in the literature (see, for example, T. J. Richardson, M. A. Shokrollahi and R. L. Urbanke, "Design of Capacity-Approaching Irregular Low-Density Parity-Check Codes", *IEEE Transactions on Information Theory*, vol. 47, no. 2, February 2001, pp. 619-673.).

The iterative decoding proceeds by repeatedly activating variable and check nodes according to some activation schedule. Messages are exchanged between check node and variable nodes that are connected and updated via (Eq. 14) and (Eq. 15). Iteration is terminated by some stopping criterion. At the conclusion of iterations, the codeword bit decisions are obtained as follows. At each variable node the sum of all incoming messages is formed and added to the channel message. If the sign of this quantity is positive, the coded bit is decided to be a 0; otherwise it is decided as a 1.

Figure 23:
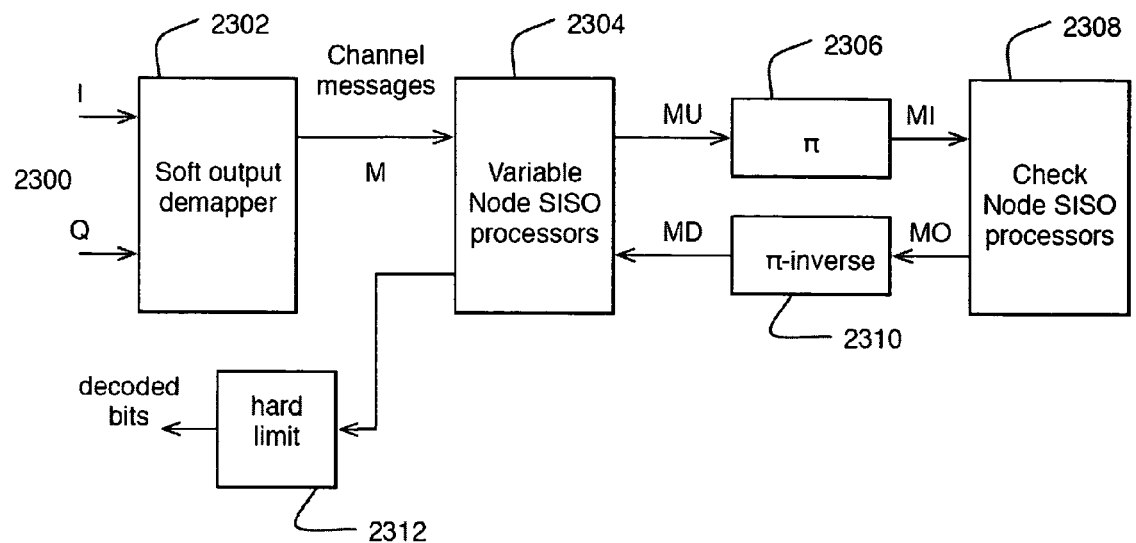
FIG. 23 is an illustrative block diagram of a decoder that can be used to decode a low density parity check code.

A diagram of a standard LDPC iterative decoder is shown in FIG. 23. Specifically, decoder 2300 comprises a soft output demapper 2302, a set of variable node soft-input-soft-output (SISO) processors 2304, a permutation device 2306, a set of check node SISO processors 2308, an inverse permutation device 2310, and a hard limit circuit 2310. The soft output demapper 2302 performs the same function as described in the decoder of 600 and provides the set of channel messages to the variable node SISO processors 2304. The variable node SISO processors accept the channel messages from the soft output demapper 2302 and messages from the inverse permutation device 2310. These messages are then updated according to the rule in (Eq. 14). These updated messages are then provided to the permutation device 2310 which accepts these and permutes these messages according to the same pattern as the edge permutation 2204. The permuted messages are provided to the check node SISO processors 2308 which accepts them and updates these messages to produce a set of messages (MO) as defined in (Eq. 15). These updated messages are provided to the inverse permutation device 2310 which permutes the messages in the reverse order of the permutation device 2306. These permuted messages are then provided as messages to be accepted by the variable node SISO processors 2304. This describes one iteration. On the first iteration, the messages provided by the inverse permutation device 2310 to the variable node SISO processors 2304 are set to zero. Iterations are stopped by some stopping rule. On the final iteration, the check node SISO processors 2308 provide to a hard limit device the messages to be compared to zero as described above.

The above describes one embodiment of a LDPC decoder wherein the messages are represented in the form of negative logarithms of likelihood ratios. Other embodiments can use other formats for the messages and different corresponding message update rules. These options are well known in the art (see, for example, S. M. Aji and R. J. McEliece, "The generalized distributive law," *IEEE Trans.~Information Theory*, vol. 46, pp. 325-343, March 2000 and F. Kschischang, B. Frey, and H.-A. Loeliger, "Factor graphs and the sum-product algorithm," *IEEE Trans.~Information Theory*, vol. 47, pp. 498-519, February 2001.).

A typical embodiment of the check node SISO processors 2308 would allow for some degree of parallel processing of the variable node message updates in (Eq. 14). The number of variable nodes processed in parallel can vary from 1 to N, depending on the implementation architecture of 2308. Similar design variations are available for the check node SISO processors 2308.

Iterative Decoding Using the Extended Parity Check Matrix

Figure 24:
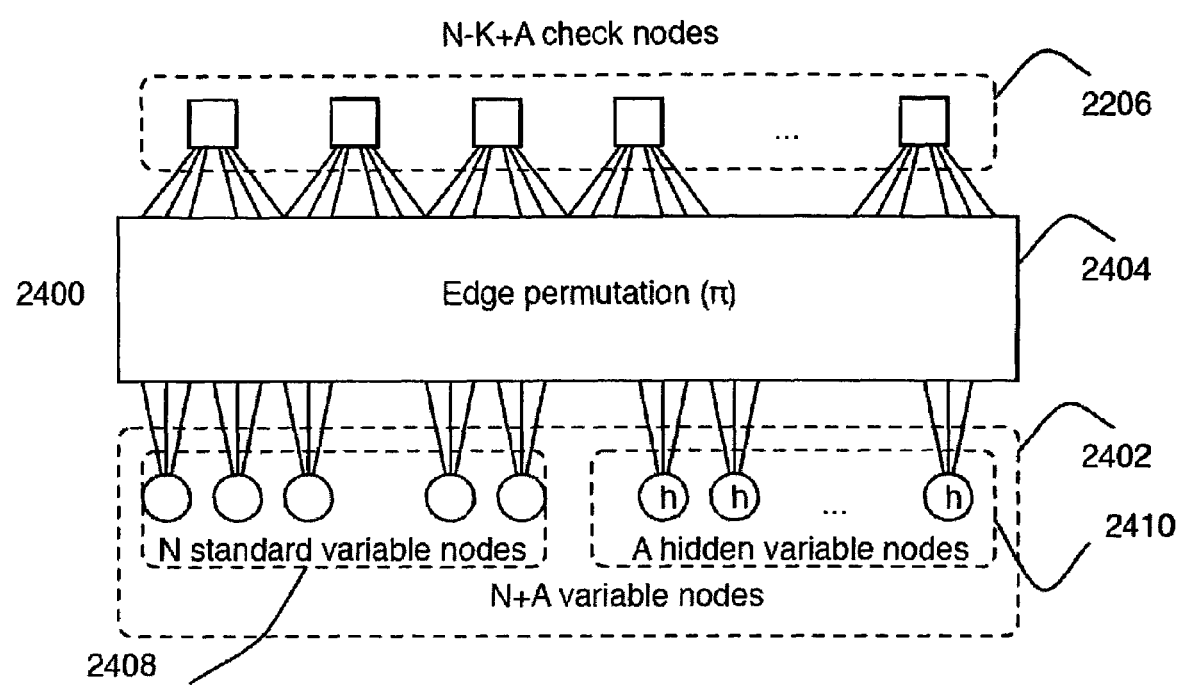
FIG. 24 shows an illustrative graphical model that can be used to represent the parity check equations of a low density parity check code containing hidden variables.

An extended parity check matrix equation also corresponds in a one to one fashion with a graph having variable nodes and check nodes. The difference between this graph and the standard parity check graph used in LDPC codes is that this graph includes variable nodes corresponding to the auxiliary variables. For the example in (Eq. 12), the corresponding graph is shown in FIG. 24. Since the dimension of the extended parity check matrix H' is (N×N+A), there are N+A variable nodes 2402 and N check nodes 2404 in the extended parity check graph. The variable nodes are shown in two groups: the N standard or "visible" variable nodes which comprise the transmitted codeword bits 2408 and the A auxiliary or hidden bits 2410. In the embodiment described above, for example, the bits comprising 2408 are those in the systematic and parity bit vectors b and p, respectively, whereas the bits in c comprise correspond to the hidden bit nodes 2410. The edge permutation pattern 2404 is defined by the locations of the 1 values in the low density extended parity check matrix H' in the same manner that a standard parity check matrix defines the edge permutation of the corresponding parity check graph. The check nodes 2406 are defined in the same manner as in a standard LDPC parity check graph, but are based on the extended parity check matrix H'. Specifically, the number of check nodes in the extended parity check graph 2400 is equal to the number of rows in H', namely N.

Iterative decoding is performed in the same manner as standard LDPC decoding with the convention that the channel message for the auxiliary variables is set to zero. All other decoding steps remain unchanged. In most applications it is not necessary to make final decisions on the auxiliary variables.

Figure 25:
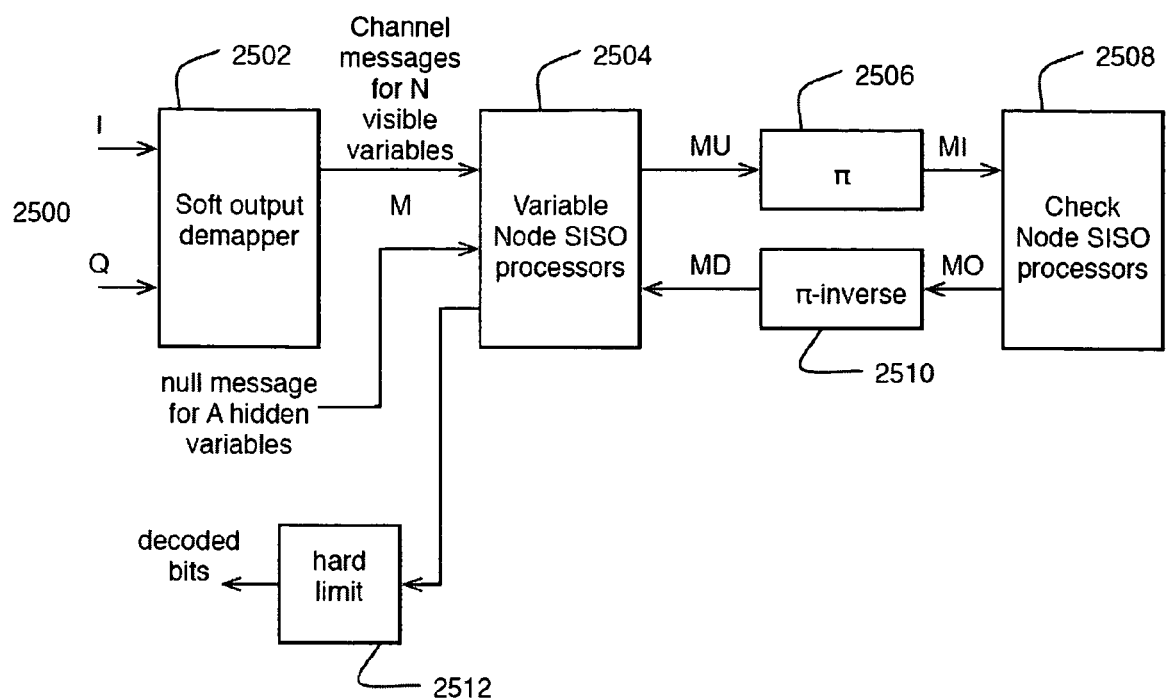
FIG. 25 is an illustrative block diagram of a decoder that can be used to decode a low density parity check code containing hidden variables.

An iterative decoder 2500 based on the extended parity check representation is shown in FIG. 25. The functionality of the decoder 2500 is similar to that of the decoder 2300 in all aspects except for the channel messages supplied to the variable node SISO processors 2504. Specifically, the channel messages corresponding to auxiliary variables are set to the null value—indicating that there is no channel soft decision information available. In the embodiment detailed in (Eq. 14), where the messages are represented in negative log likelihood ratio format, this corresponds to setting $M[j]=0$ for all hidden variable nodes.

The above describes how one may represent an embodiment the code generated by the encoder 600 using an extended parity check graph and how the code may then be decoded using LDPC iterative decoding methods. This is valid for any embodiment of the encoder 600 where the inner and outer convolutional codes are binary, linear, two state convolutional codes.

A similar result holds for codes generated by the encoder 1500. Specifically, the parity bits punctured by the puncture device 1518 can be maintained in the extended parity check equation (Eq. 12). The iterative decoding proceeds as described above and as shown in FIG. 25, but the soft output demapper 2502 is replaced by the same combination of 1802 and 1820. Specifically, the channel messages provided to the variable node SISO processors 2504 are partitioned into parity and systematic bit messages. The parity bit messages are processed by the depuncture device 1820 before providing the channel messages to the variable node SISO processors 2504. For those parity bits that are punctured, this has the effect of setting the corresponding channel messages equal to the null message.

The above description has focused on modeling the code produced by the encoder of 600 when the inner and outer convolutional codes are binary, linear, two state convolutional codes using an extended parity check matrix and graph. However, it is also possible to model such a code using a standard parity check matrix. This is possible because the auxiliary variables are related to visible (codeword) variables by a sparse binary linear operation (matrix multiplication by a sparse binary matrix). Continuing with the example embodiment leading to (Eq. 11) and (Eq. 12) this point can be demonstrated. Specifically, from (Eq. 11) since c=Gb, the vector of auxiliary variables can be eliminated. This is done by substituting this equation in the middle equation of (Eq. 11) so that the equation e=J(PR$_2$c)=J(PR$_2$Gb) is obtained. Combining this with the rightmost equation in (Eq. 11) yields Sp=J(PR$_2$Gb). Thus, equation (Eq. 11) is reduced to an equivalent set of constraints that only involves the visible codeword variables in b and p. Expressing this in matrix form yields $$[S \quad JPR_2 \quad 0]\begin{bmatrix} p \\ b \end{bmatrix} = 0 \quad (16)$$

Note that (Eq. 16) expresses a standard parity check matrix equation with the (N−K×N) parity check matrix H defined in partitioned form by [S JPR$_2$G]. Thus, the code produced by the encoder 600 can also be decoded using standard iterative LDPC decoding methods. Similarly, the code produced by the encoder 1500 can be decoded using iterative LDPC decoding with the puncturing modification as described above.

For the example embodiment considered to arrive at (Eq. 12) and (Eq. 16), (Eq. 12), which includes hidden variables, has a desirable property. Specifically, an interleaver may be defined such that the extended parity check matrix has no four cycles. However, the standard parity check matrix representation of the same code, as defined in (Eq. 16), will have many four cycles in the parity check matrix. For standard iterative LDPC decoding, four cycles are generally considered undesirable as they can adversely affect decoded bit error probability performance. For sufficiently high code rates and small block sizes, however, this adverse affect is minimal and it may be desirable perform iterative LDPC decoding of the code encoded by 1500 (or 600) using the standard low density parity check representation—i.e., with no auxiliary variables as shown, for example, in equation (Eq. 16).

The improved error correction coding scheme presented in various embodiments above allows for increased flexibility in code rate, frame size, and modulation, without significantly increases in encoder or decoder complexity. Encoders and decoders designed in accordance with the present invention may be implemented using software, hardware, or a combination of software and hardware. For example, a decoder may be implemented as an ASIC, as previously mentioned. Other types of software, hardware, or combination of software and hardware may also be used.

While the present invention has been described in terms of specific embodiments, it should be apparent to those skilled in the art that the scope of the present invention is not limited to the described specific embodiments. The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for performing data encoding comprising:
   receiving systematic data bits;
   encoding the systematic data bits according to an outer convolutional code to produce outer encoded bits;
   processing the outer encoded bits using an interleaver and a single parity check (SPC) module to produce intermediate bits, wherein the SPC module receives a first number of input bits and produces a second number of corresponding output bits, the second number being less than the first number, and wherein the SPC module takes each of the first number of input bits into account in producing the second number of output bits;
   encoding the intermediate bits according to an inner convolutional code to produce inner encoded bits;
   processing the inner encoded bits using a puncture module to produce punctured bits; and
   combining the systematic data bits and the punctured bits to produce encoded outputs.

2. The method of claim 1 wherein processing the outer encoded bits using an interleaver and a single parity check (SPC) module to produce intermediate bits further comprises operating the SPC module according to a configurable SPC rate, and wherein processing the inner encoded bits using a puncture module to produce punctured bits further comprises operating the puncture module according to a configurable rate.

3. The method of claim 2,
   wherein an overall encoding rate is associated with converting the data bits into the encoded output; and
   wherein operating the SPC module according to a configurable SPC rate further comprises the adjusting a number of bits included in the groups of bits used to generate the intermediate bits configurable SPC rate corresponds to provide a coarse rate control affecting the overall encoding rate, and adjusting the configurable puncture rate corresponds to provide a fine rate control affecting the overall encoding rate.

4. The method of clam, 1 wherein processing the inner encoded bits using a puncture module to produce punctured bits further comprises operating the puncture module using a set of periodic puncture pattern capable of supporting a plurality of possible puncture ratios.

5. A system for performing data encoding comprising:
   means for receiving systematic data bits;
   means for encoding the systematic data bits according to an outer convolutional code to produce outer encoded bits;
   means for processing the outer encoded bits using an interleaver and a single parity check (SPC) module to produce intermediate bits, wherein the SPC module includes means for receiving receives a first number of input bits and means for producing produces a second number of corresponding output bits, the second number being less than the first number, and wherein the SPC module takes each of the first number of input bits into account in producing the second number of output bits;
   means for encoding the intermediate bits according to an inner convolutional code to produce inner encoded bits;
   means for processing the inner encoded bits using a puncture module to produce punctured bits; and
   means for combining the systematic data bits and the punctured bits to produce encoded output.

* * * * *

UNITED STATES PATENT AND TRADEMARK OFFICE
CERTIFICATE OF CORRECTION

PATENT NO. : 7,673,213 B2  Page 1 of 1
APPLICATION NO. : 11/203683
DATED : March 2, 2010
INVENTOR(S) : Keith Michael Chugg et al.

It is certified that error appears in the above-identified patent and that said Letters Patent is hereby corrected as shown below:

Claim 4, Column 50, Line 39, delete "clam" and insert -- claim --

Signed and Sealed this

Twenty-seventh Day of April, 2010

David J. Kappos
*Director of the United States Patent and Trademark Office*